US012577649B2

(12) United States Patent (10) Patent No.: US 12,577,649 B2

Kim et al. (45) Date of Patent: Mar. 17, 2026

(54) MASK ASSEMBLY, METHOD OF REPAIRING THE SAME, AND METHOD OF MANUFACTURING THE SAME

(71) Applicant: Samsung Display Co., Ltd., Yongin-si (KR)

(72) Inventors: Jeongkuk Kim, Suwon-si (KR); Minho Moon, Seongnam-si (KR); Seungyong Song, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 556 days.

(21) Appl. No.: 17/981,716

(22) Filed: Nov. 7, 2022

(65) Prior Publication Data

US 2023/0193449 A1      Jun. 22, 2023

(30) Foreign Application Priority Data

Dec. 22, 2021    (KR) ........................ 10-2021-0184887

(51) Int. Cl.
| | |
|---|---|
| *C23C 14/04* | (2006.01) |
| *C23C 14/24* | (2006.01) |
| *H10K 59/122* | (2023.01) |

(52) U.S. Cl.
CPC ............ *C23C 14/042* (2013.01); *C23C 14/24* (2013.01); *H10K 59/122* (2023.02)

(58) Field of Classification Search
CPC ..... C23C 14/042; C23C 14/24; C23C 16/042; B23K 26/21; B23K 26/702; B23P 6/00; H10K 71/166
See application file for complete search history.

(56) References Cited

U.S. PATENT DOCUMENTS

| | | | |
|---|---|---|---|
| 6,589,382 B2 | 7/2003 | Clark et al. | |
| 6,749,690 B2 | 6/2004 | Clark | |
| 9,284,638 B2 | 3/2016 | Ko et al. | |
| 10,920,311 B2 | 2/2021 | Kudo et al. | |
| 2003/0108805 A1* | 6/2003 | Clark .................... | H01L 21/682 |
| | | | 430/22 |

(Continued)

FOREIGN PATENT DOCUMENTS

| | | |
|---|---|---|
| JP | 2017088936 | 5/2017 |
| JP | 6341434 | 6/2018 |

(Continued)

*Primary Examiner* — Sally A Merkling

*Assistant Examiner* — Nazmun Nahar Shams

(74) *Attorney, Agent, or Firm* — CANTOR COLBURN LLP

(57) ABSTRACT

A mask assembly includes an open mask provided with an opening and disposed on a frame, a unit mask disposed on the open mask, the unit mask including a deposition portion and welding portion, deposition openings are defined on the deposition portion to overlap the opening in a plan view, and the welding portions each protrude from the deposition portion in a protrusion direction away from the deposition portion, welding protrusions respectively disposed on the welding portions, and at least one residual structure including a residual welding portion separated from the unit mask and a residual welding protrusion disposed on the residual welding portion. The at least one residual structure is disposed between the welding portions.

10 Claims, 20 Drawing Sheets

(56)  References Cited

U.S. PATENT DOCUMENTS

| | | | |
|---|---|---|---|
| 2017/0133592 | A1 | 5/2017 | Baek |
| 2020/0152463 | A1 | 5/2020 | Ushikusa et al. |
| 2021/0249603 | A1 | 8/2021 | Kim et al. |
| 2021/0343760 | A1 | 11/2021 | Jo et al. |

FOREIGN PATENT DOCUMENTS

| | | | |
|---|---|---|---|
| KR | 1020110032284 | A | 3/2011 |
| KR | 10-2241769 | | 4/2021 |
| KR | 1020210120940 | A | 10/2021 |
| WO | 2019/009050 | | 1/2019 |

\* cited by examiner

MASK ASSEMBLY, METHOD OF REPAIRING THE SAME, AND METHOD OF MANUFACTURING THE SAME

CROSS REFERENCE TO RELATED APPLICATION(S)

This application claims priority to and benefits of Korean Patent Application No. 10-2021-0184887 under 35 U.S.C. § 119, filed on Dec. 22, 2021, in the Korean Intellectual Property Office (KIPO), the disclosure of which is incorporated by reference herein in its entirety.

BACKGROUND

1. Technical Field

The disclosure relates to a mask assembly that is repairable, a method of manufacturing the mask assembly, and a method of repairing the mask assembly.

2. Description of the Related Art

In general, a light emitting display device includes pixels and light emitting elements respectively disposed in the pixels. Each light emitting element includes a light emitting layer disposed between two electrodes. The light emitting layers included in the pixels are grouped in multiple groups.

A mask assembly is used to deposit the multiple groups of light emitting layers on a work substrate. The mask assembly includes a frame, an open mask, and a mask provided in the unit of a cell. Patterned light emitting layers are formed by placing the work substrate on the mask and depositing a light emitting material on the work substrate. Recently, in order to manufacture a large-area display device, a facility to manufacture a large-area mask and a technology for a repair method thereof are being developed.

SUMMARY

The disclosure provides a mask assembly capable of readily separating a defective unit mask therefrom and reducing a damage of an open mask in the process of separating the defective unit mask from the open mask.

The disclosure provides a method of manufacturing the mask assembly.

The disclosure provides a method of repairing the mask assembly.

Embodiments of the disclosure provide a mask assembly that may include an open mask provided with an opening and disposed on a frame, a unit mask disposed on the open mask, the unit mask including a deposition portion and welding portion, deposition openings are defined on the deposition portion to overlap the opening in a plan view, and the welding portions each protrude from the deposition portion in a protrusion direction away from the deposition portion, welding protrusions respectively disposed on the welding portions, and at least one residual structure including a residual welding portion separated from the unit mask and a residual welding protrusion disposed on the residual welding portion. The at least one residual structure may be disposed between the welding portions.

An inner edge of the open mask, which defines the opening, may overlap an entire area of the deposition portion in a plan view.

The at least one residual structure may comprise residual structures, and the welding portions may be alternately arranged with the residual structures.

The at least one residual structure may comprise residual structures, and the residual structures may be disposed between adjacent ones of the welding portions.

The residual welding portion and each of the welding portions may have a same length in a direction intersecting the protrusion direction.

Each of the welding protrusions may be disposed inside a corresponding welding portion.

The residual welding portion may have a length equal to or smaller than a length of the welding portions in the protrusion direction.

The welding protrusions and the residual welding protrusions may be aligned in a direction intersecting the protrusion direction.

The unit mask may have a thickness in a range of about 5 micrometers to about 25 micrometers.

Each of the welding portions may have a thickness smaller than a thickness of the deposition portion.

Embodiments of the disclosure provide a method of repairing a mask assembly. The method may include providing a mask assembly including an open mask provided with an opening and disposed on a frame, a first unit mask disposed on the open mask and including a first deposition portion on which first deposition openings are defined and a first welding portion protruding from the first deposition portion in a protrusion direction away from the first deposition portion, and a first welding protrusion disposed on the first welding portion, cutting a boundary between the first deposition portion and the first welding portion or the first welding portion such that at least a portion of the first deposition portion may be removed from the mask assembly, placing a first preliminary unit mask on the open mask, the first preliminary unit mask including a second deposition portion on which second deposition openings are defined and an edge portion extending from the second deposition portion, the edge portion provided with cutting lines, which may extend in a protrusion direction away from the second deposition portion, and may be arranged in a direction intersecting the protrusion direction away from the second deposition portion, the edge portion including a first area and a second area, the first area including a first welding area, a second welding area, and a third welding area, the first welding area, the second welding area, and the third welding area may be arranged in the intersecting direction and may be disposed between adjacent ones of the cutting lines, and the second area may be disposed outside the first area, welding the second welding area to the open mask, and cutting the first preliminary unit mask to cut a boundary between the second welding area and the second area or the second welding area, a boundary between the first welding area and the second deposition portion or the first welding area, and a boundary between the third welding area and the second deposition portion or the third welding area. The first welding portion may overlap the first welding area in a plan view.

In the cutting of the boundary between the first deposition portion and the first welding portion, an area of the first welding portion between a boundary of the first deposition portion and the first welding portion and the first welding protrusion may be cut.

A second welding portion may be formed in the second welding area in the cutting of the first preliminary unit mask. The method may further include cutting a boundary between the second deposition portion and the second welding portion or the second welding portion such that at least a portion of the second deposition portion may be removed from the mask assembly after the cutting of the first preliminary unit mask.

A second welding protrusion may be formed in the second welding area in the welding of the second welding area to the open mask, and the second welding protrusion may be disposed in the second welding area in a plan view.

At least one of the cutting of the boundary between the first deposition portion and the first welding portion or the first welding portion and the cutting of the first preliminary unit mask may be performed using a laser.

A distance between adjacent ones of the cutting lines may be equal to or greater than about 50 micrometers.

A length of each of the cutting lines in the protrusion direction away from the second deposition portion may be equal to or greater than about 50 micrometer.

A width of each of the cutting lines in the intersecting direction may be equal to or smaller than about 40 micrometers.

The method may further include tensioning the first preliminary unit mask in at least one of a first direction and a second direction intersecting the first direction after the cutting of the boundary between the first deposition portion and the first welding portion or the first welding portion and before the placing of the first preliminary unit mask on the open mask.

The method may further include manufacturing the mask assembly before the providing of the mask assembly. The manufacturing of the mask assembly may include placing a second preliminary unit mask in the open mask, the second preliminary unit mask including a third deposition portion on which third deposition openings are defined and an edge portion extending from the third deposition portion, the edge portion of the second preliminary unit mask including cutting lines extending in a protrusion direction away from the third deposition portion, and arranged in a direction intersecting the protrusion direction away from the third deposition portion, a third area including a fourth welding area, a fifth welding area, and a sixth welding area, each arranged in the intersecting direction, and each being disposed between adjacent ones of the cutting lines, and a fourth area disposed outside the third area. The method may further include welding the fourth welding area to the open mask, and cutting the second preliminary unit mask to cut a boundary between the fourth welding area and the fourth area or the fourth welding area, a boundary between the fifth welding area and the third deposition portion or the fifth welding area, and a boundary between the sixth welding area and the third deposition portion or the sixth welding area.

According to the above, a deposition yield and a deposition reliability of the mask assembly may be improved. Also, mask may be replaced multiple times, and thus, a manufacturing yield of a display panel may be improved.

BRIEF DESCRIPTION OF THE DRAWINGS

The above and other advantages of the disclosure will become readily apparent by reference to the following detailed description when considered in conjunction with the accompanying drawings wherein:

FIG. 5B is a perspective view of a method of manufacturing a mask assembly according to an embodiment of the disclosure;

FIG. 7B is a perspective view of a method of manufacturing a mask assembly according to an embodiment of the disclosure;

DETAILED DESCRIPTION OF THE EMBODIMENTS

Figure 1:
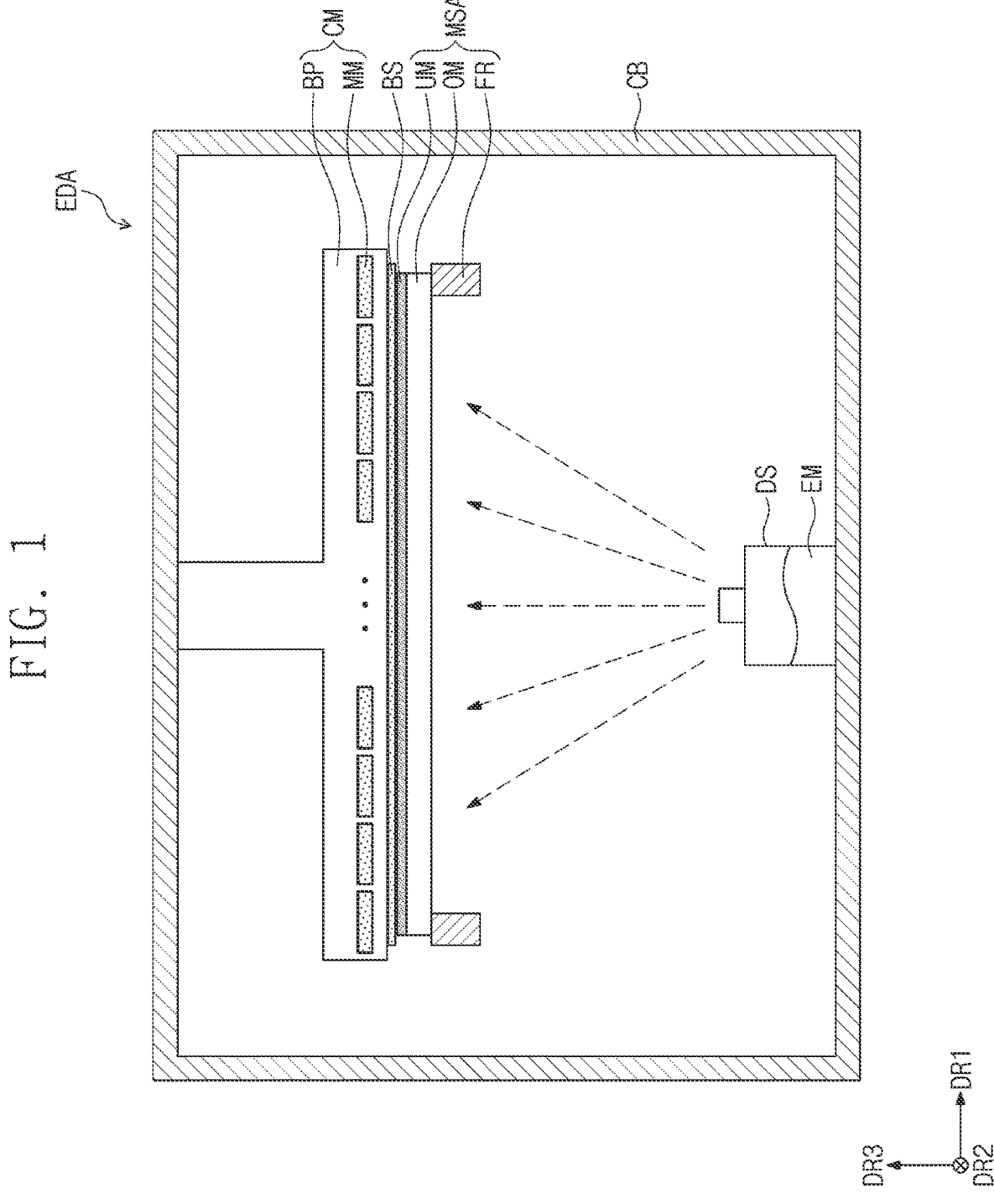
FIG. 1 is schematic a cross-sectional view of a deposition apparatus according to an embodiment of the disclosure.

In the disclosure, it will be understood that when an element (or area, layer, or portion) is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another elements or features as shown in the figures.

It will be further understood that the terms "include" and/or "including", when used in this specification, specify the presence of stated features, integers, steps, operations, elements, and/or components, but do not preclude the presence or addition of one or more other features, integers, steps, operations, elements, components, and/or groups thereof.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the disclosure will be described with reference to accompanying drawings.

FIG. 1 is a schematic cross-sectional view of a deposition apparatus EDA according to an embodiment of the disclosure.

Referring to FIG. 1, the deposition apparatus EDA may include a deposition chamber CB, a fixing member CM, a deposition source DS disposed in the deposition chamber CB, and a mask assembly MSA disposed in the deposition chamber CB. Although not shown in figures, the deposition apparatus EDA may further include additional mechanical apparatuses to implement an inline system.

A deposition condition of the deposition chamber CB may be set to a vacuum state. The deposition chamber CB may include a bottom surface, a ceiling surface, and sidewalls. The bottom surface of the deposition chamber CB may be substantially parallel to a plane defined by a first direction DR1 and a second direction DR2. A third direction DR3 may indicate a normal direction of the bottom surface of the deposition chamber CB.

The fixing member CM may be disposed in the deposition chamber CB, may be disposed above the deposition source DS, and may fix the mask assembly MSA. The fixing member CM may be installed at the ceiling surface of the deposition chamber CB. The fixing member CM may include a jig or a robot arm to hold the mask assembly MSA.

The fixing member CM may include a body portion BD and magnetic substances MM coupled to the body portion BD. The body portion BD may include a plate as a base structure thereof to fix the mask assembly MSA, however, it should not be particularly limited. The magnetic substances MM may be disposed inside or outside of the body portion BD. The magnetic substances MM may fix the mask assembly MSA using a magnetic force, and thus, a base substrate BS may be tightly adhered to the mask assembly MSA.

The deposition source DS may evaporate a deposition material EM, e.g., a light emitting material, and may spray the evaporated deposition material as a vapor. The sprayed deposition material EM may be deposited on the base substrate BS in a pattern after passing through the mask assembly MSA. The base substrate BS may correspond to a substrate in an intermediate stage of manufacturing a display panel DP described with reference to FIG. 9.

The mask assembly MSA may be disposed in the deposition chamber CB and may be disposed above the deposition source DS. The mask assembly MSA may support the base substrate BS disposed on the mask assembly MSA.

In the embodiment, the mask assembly MSA may include a frame FR, an open mask OM, and a unit mask UM. The unit mask UM may be a mask that is used to perform a deposition process on the base substrate BS in the unit of a cell forming one display panel DP. This will be described in detail later.

The base substrate BS may be disposed between the mask assembly MSA and the fixing member CM. The base substrate BS may include a glass substrate or a plastic substrate. The base substrate BS may include a polymer layer disposed on the glass substrate or the plastic substrate. The base substrate BS may be provided as a base surface of a layer formed by the deposition apparatus EDA. Accordingly, the base substrate BS should not be particularly limited as long as the base substrate BS is a component of the display panel DP and is disposed under a component, which is formed by the deposition process, of the display panel DP (refer to FIG. 9) described later. The base substrate BS may be removed from the display panel DP after a manufacturing process of the display panel DP is completed, however, it should not be particularly limited.

Figure 2:
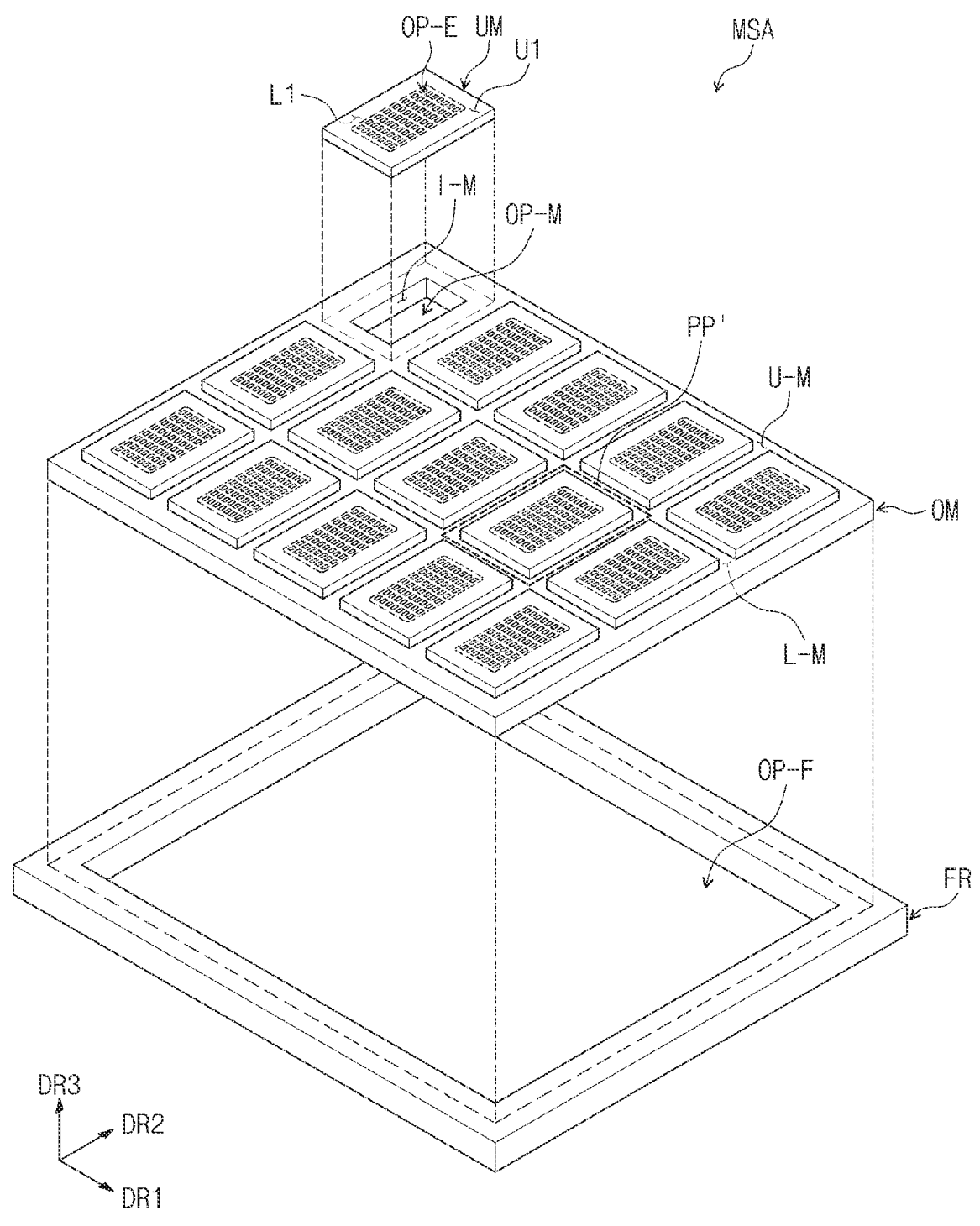
FIG. 2 is an exploded perspective view of a mask assembly according to an embodiment of the disclosure.
Figure 3A:
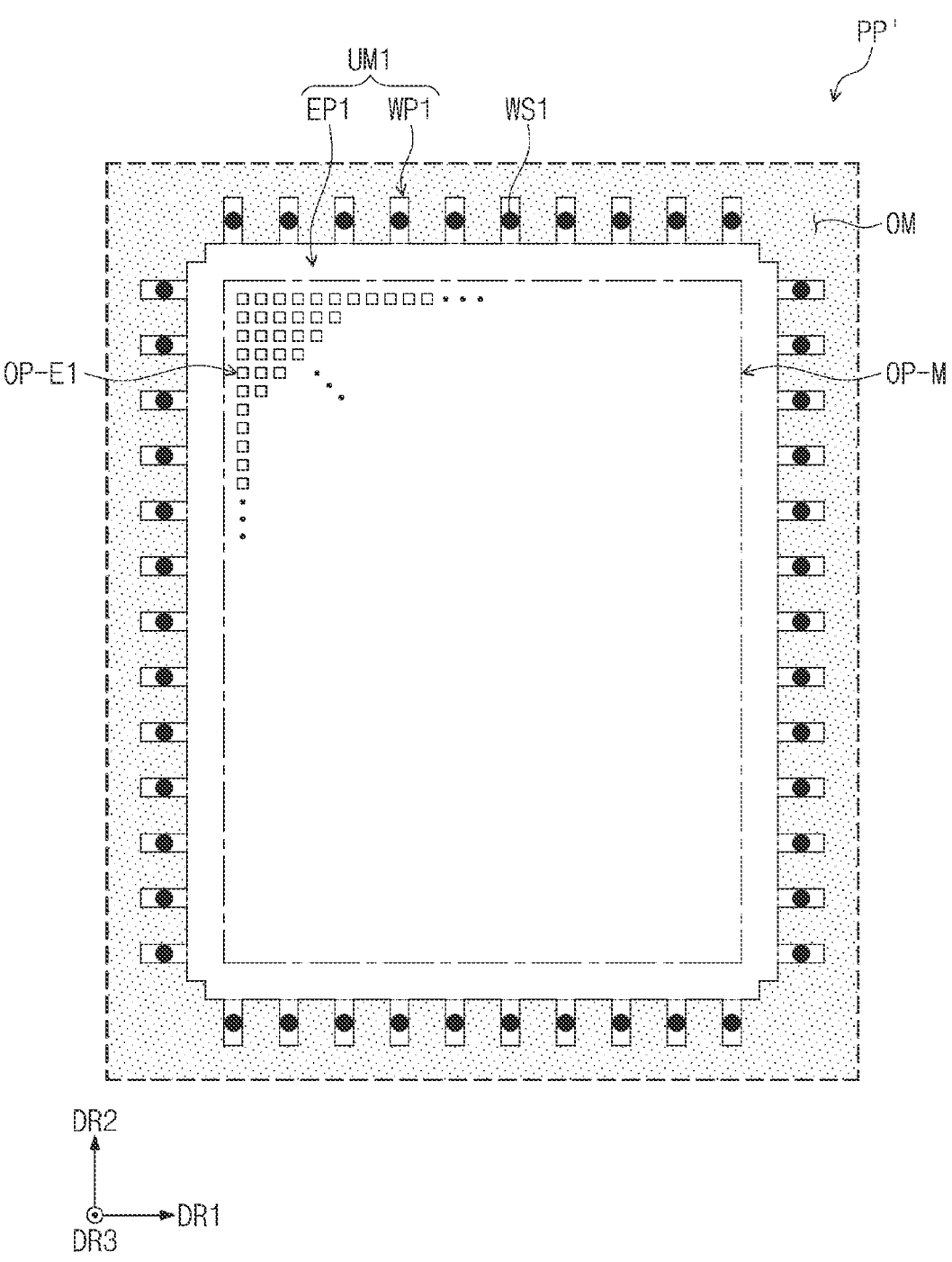
FIG. 3A is an enlarged plan view of area PP' of FIG. 2.
Figure 3B:
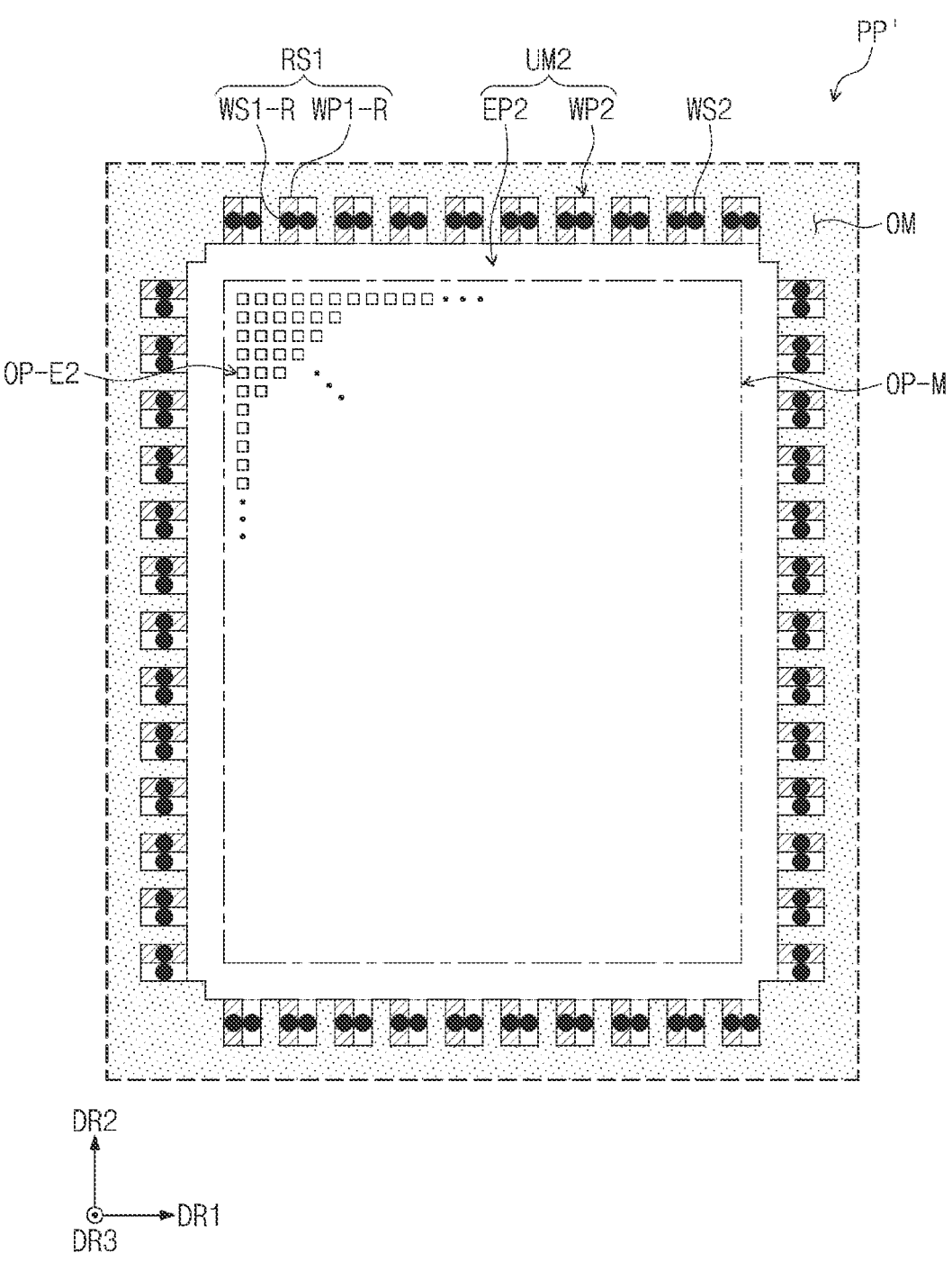
FIG. 3B is an enlarged plan view of area PP' of FIG. 2.

FIG. 2 is an exploded perspective view of the mask assembly MSA according to an embodiment of the disclosure. FIG. 3A is an enlarged plan view of area PP' of FIG. 2. FIG. 3B is an enlarged plan view of area PP' of FIG. 2.

Referring to FIG. 2, the mask assembly MSA may include the frame FR, the open mask OM, and the unit mask UM.

The frame FR may be disposed under the open mask OM and the unit mask UM and may support the open mask OM and the unit mask UM.

According to an embodiment, the frame FR may include sticks extending in the first direction DR1 and sticks extending in the second direction DR2. The sticks extending in the second direction DR2 may extend from both ends of the sticks extending in the first direction DR1, respectively. The sticks extending in the first and second directions DR1 and DR2 may be connected to each other to define a frame opening OP-F.

The deposition material EM (refer to FIG. 1) sprayed by the deposition source DS (refer to FIG. 1) may pass through openings defined through the open mask OM and the unit mask UM after passing the frame opening OP-F.

In the embodiment, one frame opening OP-F is defined through the frame FR as an embodiment, however, multiple frame openings OP-F may be defined through the frame FR. One open mask OM may be supported by multiple frames FR.

The shape of the frame FR should not be particularly limited as long as the frame FR may support the open mask OM. The frame FR may be fixed to the sidewalls of the deposition chamber CB (refer to FIG. 1), and it should not be particularly limited.

The frame FR may include a metal material. The frame FR may include, for example, stainless steel (SUS), Invar, nickel (Ni), an alloy of nickel and cobalt, an alloy of nickel and iron, or the like.

The open mask OM may be disposed on the frame FR. The open mask OM may include a lower surface L-M that is in contact with the frame FR and an upper surface U-M opposite to the lower surface L-M. The open mask OM may have a rectangular shape defined by long sides extending in the first direction DR1 and short sides extending in the second direction DR2 in a plan view. However, the shape of the open mask OM should not be particularly limited thereto.

The open mask OM may be provided with an opening OP-M defined therethrough by removing a portion of the open mask OM from the upper surface U-M to the lower surface L-M in the third direction DR3.

According to an embodiment, multiple openings OP-M may be defined on the open mask OM. The openings OP-M may be formed by penetrating the open mask OM in the thickness direction of the open mask OM. The openings OP-M may be arranged in the first direction DR1 and the second direction DR2. FIG. 2 shows the openings OP-M arranged in five rows by three columns (5×3) as an embodiment, however, the number and the arrangement of the openings OP-M should not be limited thereto or thereby.

The openings OP-M may be disposed to overlap the frame opening OP-F. Accordingly, the deposition material EM (refer to FIG. 1) sprayed by the deposition source DS (refer to FIG. 1) may be provided to the openings OP-M without being interfered with the frame FR.

Inner side surfaces I-M of the open mask OM, which respectively define the openings OP-M, may include short sides extending in the first direction DR1 and long sides extending from the short sides in the second direction DR2. Each of the openings OP-M may have a rectangular shape or may have a quadrangular shape having rounded corners (or having corners with a curvature) where the long sides meet the short sides in a plan view.

The open mask OM may include a metal material. According to an embodiment, the open mask OM may include at least one of stainless steel (SUS), Invar, nickel (Ni), cobalt (Co), an alloy of nickel, and an alloy of nickel and cobalt.

The unit mask UM may be disposed on the open mask OM. For example, the unit mask UM may be disposed on the upper surface U-M of the open mask OM. The unit mask UM may include a lower surface L1 that is in contact with the open mask OM and an upper surface U1 opposite to the lower surface L1.

According to an embodiment, the unit mask UM may be provided in plural. The unit masks UM may be disposed to correspond to the openings OP-M. For example, each of the unit masks UM may be disposed to overlap a corresponding opening among the openings OP-M.

Accordingly, the unit masks UM may be arranged in the first direction DR1 and the second direction DR2. In FIG. 2, the unit masks UM are arranged in five rows by three columns (5×3), however, the number and the arrangement of the unit masks UM should not be particularly limited.

Each of the unit masks UM may include a metal material. According to an embodiment, each of the unit masks UM may include at least one of stainless steel (SUS), Invar, nickel (Ni), cobalt (Co), an alloy of nickel, and an alloy of nickel and cobalt.

According to the embodiment, each of the unit masks UM may include deposition openings OP-E formed by removing a portion of the unit mask UM from the upper surface U1 to the lower surface L1 in the third direction DR3.

The deposition openings OP-E may be exposed through the opening OP-M without being covered by the open mask OM. Accordingly, the deposition material EM (refer to FIG. 1) sprayed by the deposition source DS (refer to FIG. 1) may be provided to the deposition openings OP-E without being interfered with the opening mask OM, and the deposition material EM may be deposited on the base substrate BS (refer to FIG. 1) to form a deposition pattern corresponding to the deposition openings OP-E.

According to an embodiment, each of the unit masks UM may have a thickness equal to or greater than about 5 micrometers and equal to or smaller than about 25 micrometers. In case that the thickness of each of the unit masks UM is greater than about 25 micrometers, an adhesion between the unit masks UM and the base substrate BS may be reduced, and a shadow phenomenon in which the deposition material EM is deposited on the base substrate BS in addition to the deposition pattern may occur. Accordingly, defects may occur in the display panel DP in manufacturing the display panel DP with high resolution (refer to FIG. 9).

FIG. 3A shows the mask assembly before a repair process. According to the embodiment, the mask assembly MSA (refer to FIG. 2) may include the frame FR (refer to FIG. 2), the open mask OM, a first unit mask UM1, and first welding protrusions WS1. The first unit mask UM1 may correspond to the unit mask UM described with reference to FIG. 2.

Referring to FIG. 3A, the first unit mask UM1 may include a first deposition portion EP1 and first welding portions WP1.

First deposition openings OP-E1 may be defined on the first deposition portion EP1. First deposition openings OP-E1 may be formed by penetrating he first deposition portion EP1 in the thickness direction of the first unit mask UM1. According to an embodiment, the first deposition openings OP-E1 may be arranged in the first and second directions DR1 and DR2. However, the arrangement direction of the first deposition openings OP-E1 should not be limited thereto or thereby.

According to an embodiment, each of the first deposition openings OP-E1 may have a quadrangular shape in a plan view. However, the shape of the first deposition openings OP-E1 should not be limited to the quadrangular shape. For example, each of the first deposition openings OP-E1 may have a lozenge shape or a circular shape.

The first unit mask UM1 may be disposed such that an inner edge of the open mask OM, which defines the opening OP-M, may entirely overlap the first deposition portion EP1 in a plan view. In FIG. 3A, the opening OP-M of the open mask OM is shown with a dash-dotted line.

The first welding portions WP1 may protrude from the first deposition portion EP1 in a plan view. Each of the first welding portions WP1 may protrude from the first deposition portion EP1 in a direction away from the first deposition portion EP1.

According to an embodiment, the first deposition portion EP1 may include end portions extending in the first direction DR1 and facing each other in the second direction DR2 and end portions extending in the second direction DR2 and facing each other in the first direction DR1. Some of the first welding portions WP1 may protrude from the end portions, which extend in the first direction DR1, of the first deposition portion EP1 to the second direction DR2 and a direction opposite to the second direction DR2. Rest of the first welding portions WP1 may protrude from the end portions, which extend in the second direction DR2, of the first deposition portion EP1 to the first direction DR1 and a direction opposite to the first direction DR1.

The first welding protrusions WS1 may be respectively disposed on the first welding portions WP1 of the first unit mask UM1. Each of the first welding protrusions WS1 may be disposed inside of a corresponding first welding portion among the first welding portions WP1.

The first welding protrusions WS1 may be formed in a process of welding the first unit mask UM1 to the open mask OM to combine the first unit mask UM1 with the open mask OM.

FIG. 3B shows the mask assembly MSA (refer to FIG. 2) that is repaired one time. Referring to FIG. 3B, the mask assembly MSA may include the frame FR (refer to FIG. 2), the open mask OM, first residual structures RS1, a second unit mask UM2, and second welding protrusions WS2. The second unit mask UM2 may correspond to the unit mask UM described with reference to FIG. 2. In FIG. 3B, the same/similar reference numerals denote the same/similar elements in FIGS. 1 to 3A, and thus, detailed descriptions of the same/similar elements will be omitted.

In the embodiment, the first residual structures RS1 may include first residual welding portions WP1-R and first residual welding protrusions WS1-R.

In the embodiment, the first residual structures RS1 may be formed from the first unit mask UM1 (refer to FIG. 3A). According to the disclosure, a portion of the first unit mask UM1 may be separated from the mask assembly MSA by cutting a damaged first unit mask UM1. The first unit mask UM1 may be cut to allow at least a portion of each of the first welding portions WP1 (refer to FIG. 3A) and the first welding protrusions WS1 (refer to FIG. 3A) to remain on the open mask OM.

The first welding portions WP1 remaining on the open mask OM may be defined as the first residual welding portions WP1-R. The first welding protrusions WS1 remaining on the open mask OM may be defined as the first residual welding protrusions WS1-R. The first residual welding protrusions WS1-R may be disposed on the first residual welding portions WP1-R, respectively. The cutting process will be described in detail later.

In the embodiment, the second unit mask UM2 may be a new unit mask that is disposed on the open mask OM after the damaged portion of the first unit mask UM1 is removed. The second unit mask UM2 may include a second deposition portion EP2 and second welding portions WP2.

Second deposition openings OP-E2 may be defined on the second deposition portion EP2. Second deposition openings OP-E2 may be formed by penetrating the second deposition portion EP2 in the thickness direction of the second unit mask UM2. The second welding portions WP2 may protrude from the second deposition portion EP2 in a direction away from the second deposition portion EP2.

In the embodiment, each of the second welding portions WP2 may be disposed between the first residual structures RS1. According to an embodiment, the second welding portions WP2 may be alternately arranged with the first residual structures RS1. For example, each of the first residual structures RS1 may also be disposed between the second welding portions WP2.

However, FIG. 3B shows the mask assembly MSA that is repaired one time, and the mask assembly MSA that is repaired multiple times may include multiple first residual structures RS1 disposed between two second welding portions WP2 adjacent to each other among the second welding portions WP2.

According to an embodiment, the first residual welding portion WP1-R may have a same length as a length of the second welding portions WP2 in a direction intersecting a direction in which the second welding portions WP2 protrude from the second deposition portion EP2.

According to an embodiment, the length of the first residual welding portion WP1-R may be equal to or smaller than the length of the second welding portions WP2 in the direction in which the second welding portions WP2 protrude from the second deposition portion EP2.

The second welding protrusions WS2 may be respectively disposed on the second welding portions WP2 of the second unit mask UM2. Each of the second welding protrusions WS2 may be disposed inside of a corresponding second welding portion among the second welding portions WP2.

The second welding protrusions WS2 may be formed in a process of welding the second unit mask UM2 to the open mask OM to combine the second unit mask UM2 with the open mask OM.

According to an embodiment, the second welding protrusions WS2 may be alternately arranged with the first residual welding protrusions WS1-R. The second welding protrusions WS2 and the first residual welding protrusions WS1-R may be aligned with each other in a direction intersecting the direction in which the second welding portions WP2 protrude from the second deposition portion EP2.

Figure 4:
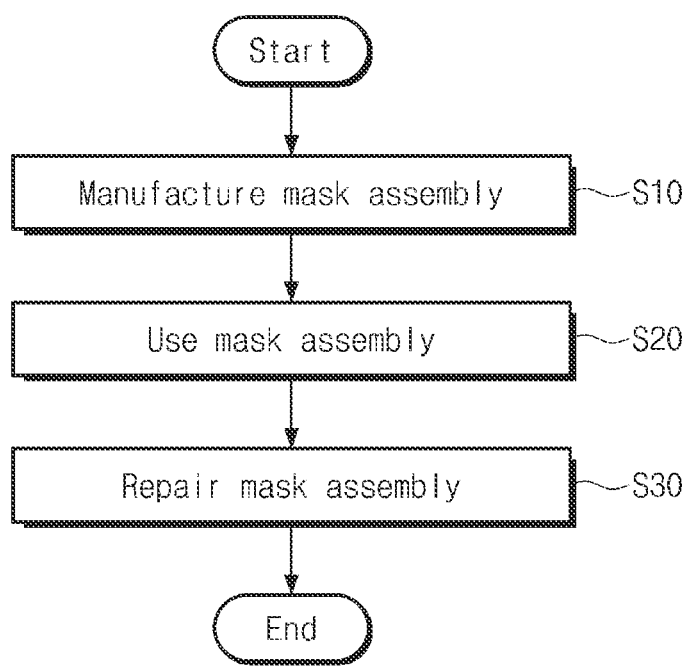
FIG. 4 is a flowchart of a method of repairing a mask assembly according to an embodiment of the disclosure.

FIG. 4 is a flowchart of a method of repairing the mask assembly MSA according to an embodiment of the disclosure.

Referring to FIG. 4, the repair method of the mask assembly MSA (refer to FIG. 2) may include manufacturing the mask assembly MSA (S10), using the mask assembly MSA (S20), and repairing the mask assembly MSA (S30).

According to an embodiment, the using of the mask assembly MSA (S20) and the repairing of the mask assembly MSA (S30) may be repeated multiple times after the repairing of the mask assembly MSA (S30). For example, the using of the mask assembly MSA (S20) and the repairing of the mask assembly MSA (S30) may be repeated twenty times or more.

Hereinafter, the manufacturing of the mask assembly MSA (S10) will be described in detail with reference to FIGS. 5A to 5I. The repairing of the mask assembly MSA (S30) will be described in detail with reference to FIGS. 6A to 6G.

FIGS. 5A, 5D, 5F, and 5H are plan views showing the manufacturing method of the mask assembly according to an embodiment of the disclosure. FIG. 5B is a perspective view showing the manufacturing method of the mask assembly according to an embodiment of the disclosure. FIGS. 5C, 5E, 5G, and 5I are schematic cross-sectional views showing the manufacturing method of the mask assembly according to an embodiment of the disclosure.

Figure 5A:
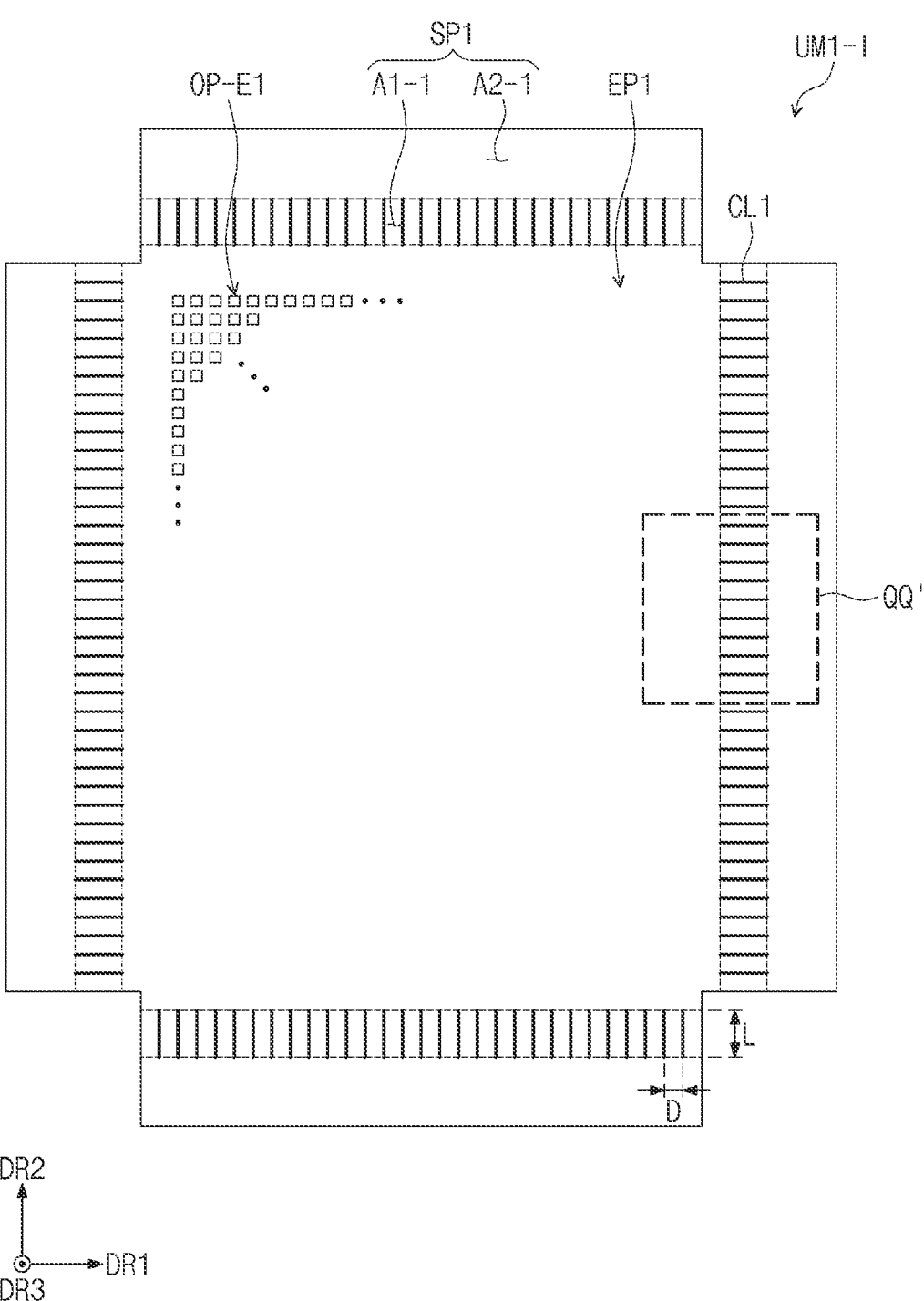
FIG. 5A is a plan view of a method of manufacturing a mask assembly according to an embodiment of the disclosure.
Figure 5B:
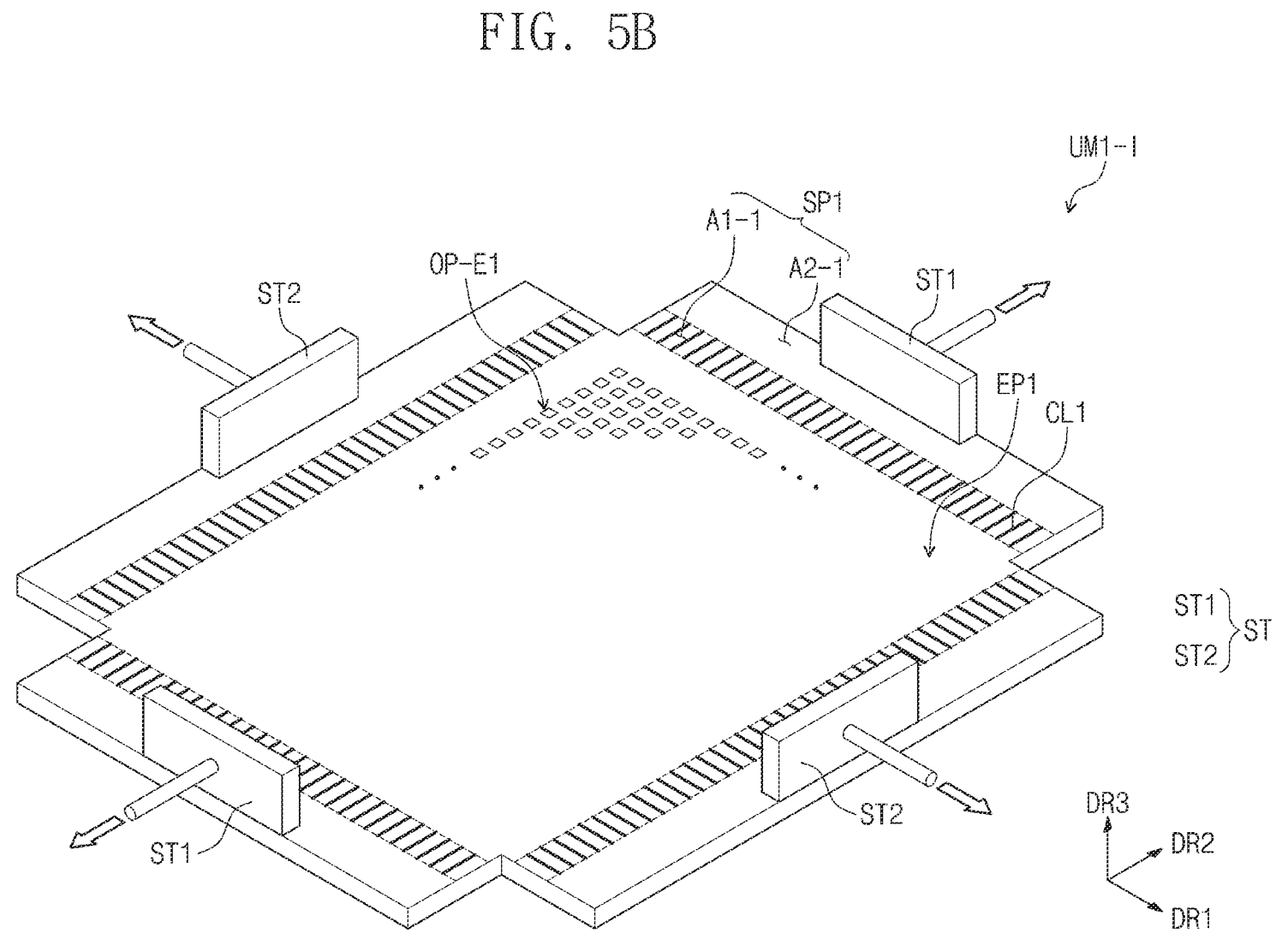

Referring to FIG. 5A, the manufacturing of the mask assembly MSA (refer to FIG. 2) (S10, refer to FIG. 4) may include providing a first preliminary unit mask UM1-I.

The first preliminary unit mask UM1-I may include a first deposition portion EP1 and a first edge portion SP1.

The first deposition openings OP-E1 may be defined on the first deposition portion EP1. The first deposition portion EP1 and the first deposition openings OP-E1 of the first preliminary unit mask UM1-I may correspond to the first deposition portion EP1 and the first deposition openings OP-E1 of the first unit mask UM1 described with reference to FIG. 3A, respectively.

The first edge portion SP1 may extend from the first deposition portion EP1. In the embodiment, the first edge portion SP1 may be provided in plural. For example, the first edge portions SP1 may include two first edge portions SP1 extending from the first deposition portion EP1 to the first direction DR1 and the direction opposite to the first direction DR1 and facing each other in the first direction DR1. The first edge portions SP1 may include two first edge portions SP1 extending from the first deposition portion EP1 to the second direction DR2 and the direction opposite to the second direction DR2 and facing each other in the second direction DR2.

In the embodiment, each of the first edge portions SP1 may include a first area A1-1 and a second area A2-1.

The first area A1-1 may be an area in which first cutting lines CL1 are defined. The first cutting lines CL1 may be formed on the first preliminary unit mask UM1-I from an upper surface to a lower surface of the first preliminary unit mask UM1-I in the third direction DR3.

Each of the first cutting lines CL1 may extend in the direction parallel to the direction in which a corresponding first edge portion SP1 extends from the first deposition portion EP1. The first cutting lines CL1 may be arranged in a direction intersecting the direction in which corresponding first edge portions SP1 extend from the first deposition portion EP1.

Accordingly, the first cutting lines CL1, which extend in the first direction DR1 and are arranged in the second direction DR2, may be defined in first edge portions SP1 extending from the first deposition portion EP1 to the first direction DR1. The first cutting lines CL1, which extend in the second direction DR2 and are arranged in the first direction DR1, may be defined in the first edge portions SP1 extending from the first deposition portion EP1 to the second direction DR2.

The first area A1-1 may be defined between an imaginary line extending along one ends of the first cutting lines CL1 and an imaginary line extending along the other ends of the first cutting lines CL1.

A distance D between adjacent first cutting lines CL1 may be equal to or greater than about 50 micrometers. A length L of each of the first cutting lines CL1 in the extension direction of the first cutting lines CL1 may be equal to or greater than about 50 micrometers. In a case where the distance D between adjacent first cutting lines CL1 is smaller than about 50 micrometers or the length L of each of the first cutting lines CL1 in the extension direction is smaller than about 50 micrometers, the distance D of the adjacent first cutting lines CL1 or the length L of the first cutting lines CL1 may be shorter than a length (or a diameter) of each of the first welding protrusions WS1 formed in the following process, and a portion of the first preliminary unit mask UM1-I, which needs to be removed, may not be removed in the manufacturing of the mask assembly MSA (S10, refer to FIG. 3) or in the repairing of the mask assembly MSA (S30, refer to FIG. 4).

In the direction in which the first cutting lines CL1 are arranged, the first cutting lines CL1 may have a width equal to or smaller than about 40 micrometers. For example, the width of the first cutting lines CL1 may be equal to or greater than about 10 micrometers and equal to or smaller than about 30 micrometers in the direction in which the first cutting lines CL1 are arranged.

According to an embodiment, the first cutting lines CL1 may be formed by a photolithography process. The photolithography process may be substantially simultaneously performed together with a photolithography process used to manufacture the first edge portions SP1 of the first unit mask UM1. However, the method of forming the first cutting lines CL1 should not be particularly limited.

The second area A2-1 may be disposed outside of the first area A1-1. For example, the second area A2-1 may be disposed at an outermost position of the first preliminary unit mask UM1-I.

Referring to FIG. 5B, the manufacturing (S10, refer to FIG. 4) of the mask assembly MSA (refer to FIG. 2) may include tensioning the first preliminary unit mask UM1-I.

Support portions ST may be disposed in the second areas A2-1 of the first preliminary unit mask UM1-I. The support portions ST may include first support portions ST1 and second support portions ST2.

The first support portions ST1 may be disposed respectively adjacent to end portions of the second areas A2-1 extending from the corresponding first area A1-1 in the second direction DR2 and the direction opposite to the second direction DR2 among the second areas A2-1 of the first preliminary unit mask UM1-I. The second support portions ST2 may be disposed respectively adjacent to end portions of the second areas A2-1 extending from the corresponding first area A1-1 in the first direction DR1 and the direction opposite to the first direction DR1 among the second areas A2-1 of the first preliminary unit mask UM1-I.

The first support portions ST1 may apply a tensile force to the first preliminary unit mask UM1-I in the second direction DR2 and the direction opposite to the second direction DR2, respectively. The second support portions ST2 may apply a tensile force to the first preliminary unit mask UM1-I in the first direction DR1 and the direction opposite to the first direction DR1.

The support portions ST may be implemented in various ways as long as the support portions ST may fix the end portions of the first preliminary unit mask UM1-I and may apply tensile force. For example, the support portions ST may be a device, such as a porous chuck or a clamp. The porous chuck may be, but not limited to, a vacuum chuck.

Figure 5C:
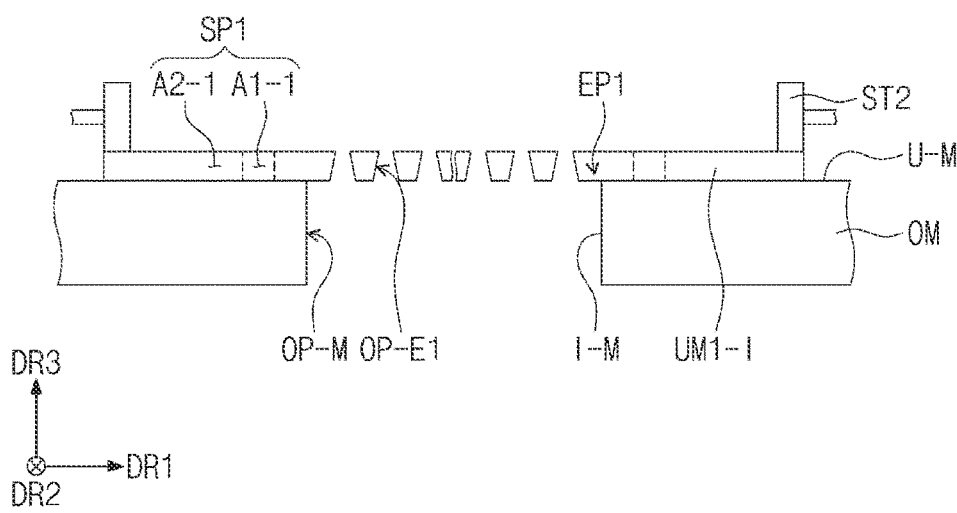
FIG. 5C is a schematic cross-sectional view of a method of manufacturing a mask assembly according to an embodiment of the disclosure.

Referring to FIG. 5C, the manufacturing (S10, refer to FIG. 4) of the mask assembly MSA (refer to FIG. 2) may include placing the first preliminary unit mask UM1-I on the open mask OM.

In the embodiment, the first preliminary unit mask UM1-I may be disposed such that the inner side surface I-M of the open mask OM, which defines the opening OP-M, may entirely overlap the first deposition portion EP1 in a plan view.

According to an embodiment, the open mask OM and the first preliminary unit mask UM1-I may be disposed in an upright state to extend in the third direction DR3. An upper surface of the first preliminary unit mask UM1-I may be in contact with the porous chuck. The first preliminary unit mask UM1-I may move by the porous chuck to be in contact with the upper surface U-M of the open mask OM.

However, the process of placing the first preliminary unit mask UM1-I should not be limited thereto or thereby, and as shown in FIG. 5C, the open mask OM and the first preliminary unit mask UM1-I may be disposed in a horizontal state.

Figure 5D:
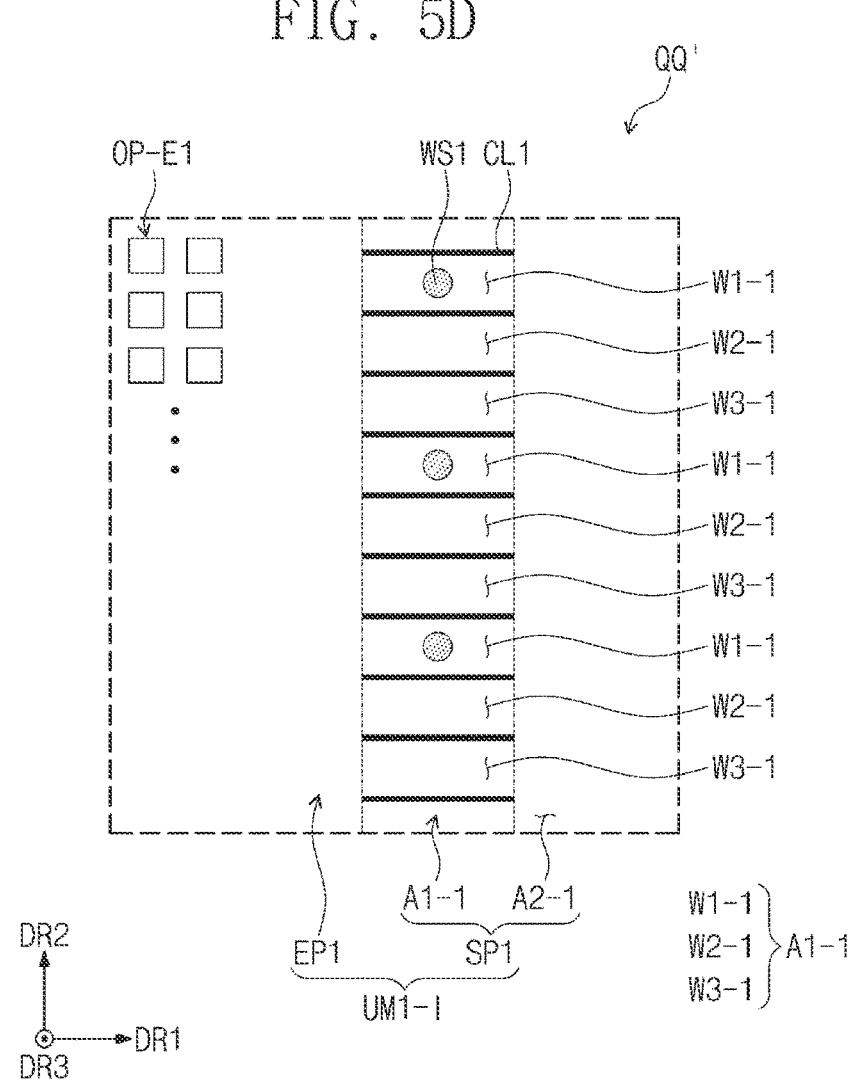
FIG. 5D is a plan view of a method of manufacturing a mask assembly according to an embodiment of the disclosure.
Figure 5E:
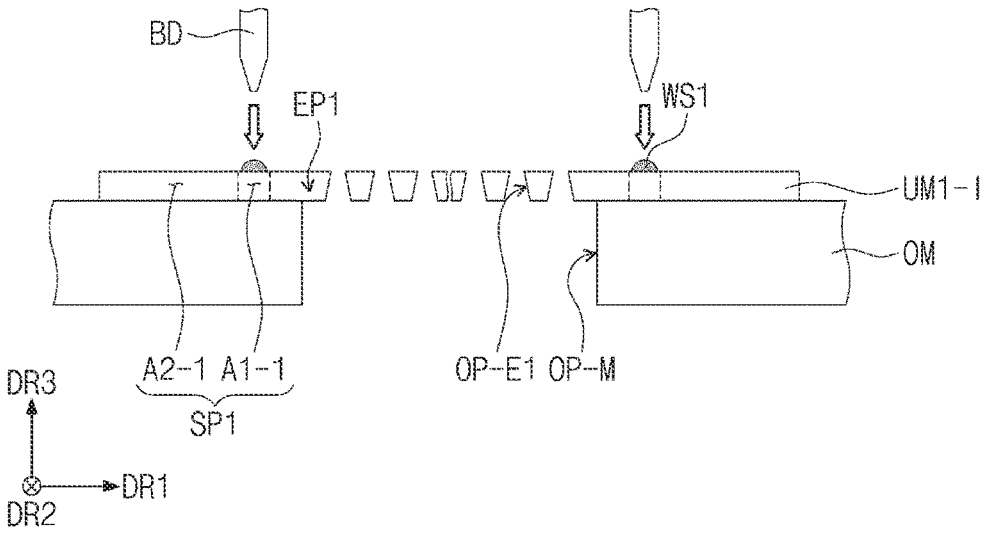
FIG. 5E is a schematic cross-sectional view of a method of manufacturing a mask assembly according to an embodiment of the disclosure.

Referring to FIGS. 5D and 5E, the manufacturing (S10, refer to FIG. 4) of the mask assembly MSA (refer to FIG. 2) may include welding the first preliminary unit mask UM1-I to the open mask OM.

The first area A1-1 may include a first welding area W1-1, a second welding area W2-1, and a third welding area W3-1.

Each of the first, second, and third welding areas W1-1, W2-1, and W3-1 may be disposed between adjacent first cutting lines among the first cutting lines CL1. For example, in the first area A1-1 defined between an imaginary line connecting one end portions of the first cutting lines CL1 and an imaginary line connecting the other end portions of the first cutting lines CL1, the first, second, and third welding areas W1-1, W2-1, and W3-1 may be defined by the first cutting lines CL1 to be distinguished from each other.

The first, second, and third welding areas W1-1, W2-1, and W3-1 may be arranged in the direction intersecting the extension direction of the first cutting lines CL1. FIG. 5D shows a structure in which the first, second, and third welding areas W1-1, W2-1, and W3-1 are arranged parallel to each other and the first, second, and third welding areas W1-1, W2-1, and W3-1 are repeatedly arranged.

According to an embodiment, the first welding areas W1-1 may be welded to the open mask OM, and thus, the first preliminary unit mask UM1-I may be coupled to the open mask OM.

As shown in FIG. 5E, the first preliminary unit mask UM1-I may be coupled to the open mask OM using a bonding machine BD. The bonding machine BD may be a welding device or a laser oscillator. The bonding machine BD may provide a heat beam or a laser beam onto the first welding area W1-1 of the first area A1-1. A portion of the open mask OM may be melted, and thus, the open mask OM may be coupled to the first preliminary unit mask UM1-I.

After the welding process is performed on the first welding area W1-1, the first welding protrusions WS1 may be formed in the first welding area W1-1. As shown in FIG. 5E, the first welding protrusions WS1 may be formed to protrude from the first welding area W1-1 in a cross-sectional view, however, it should not be limited thereto or thereby. According to an embodiment, a portion of the first welding protrusions WS1 may not protrude from the first welding area W1-1.

Referring to FIGS. 5F to 5I, the manufacturing (S10, refer to FIG. 4) of the mask assembly MSA (refer to FIG. 2) may include cutting the first preliminary unit mask UM1-I.

Figure 5F:
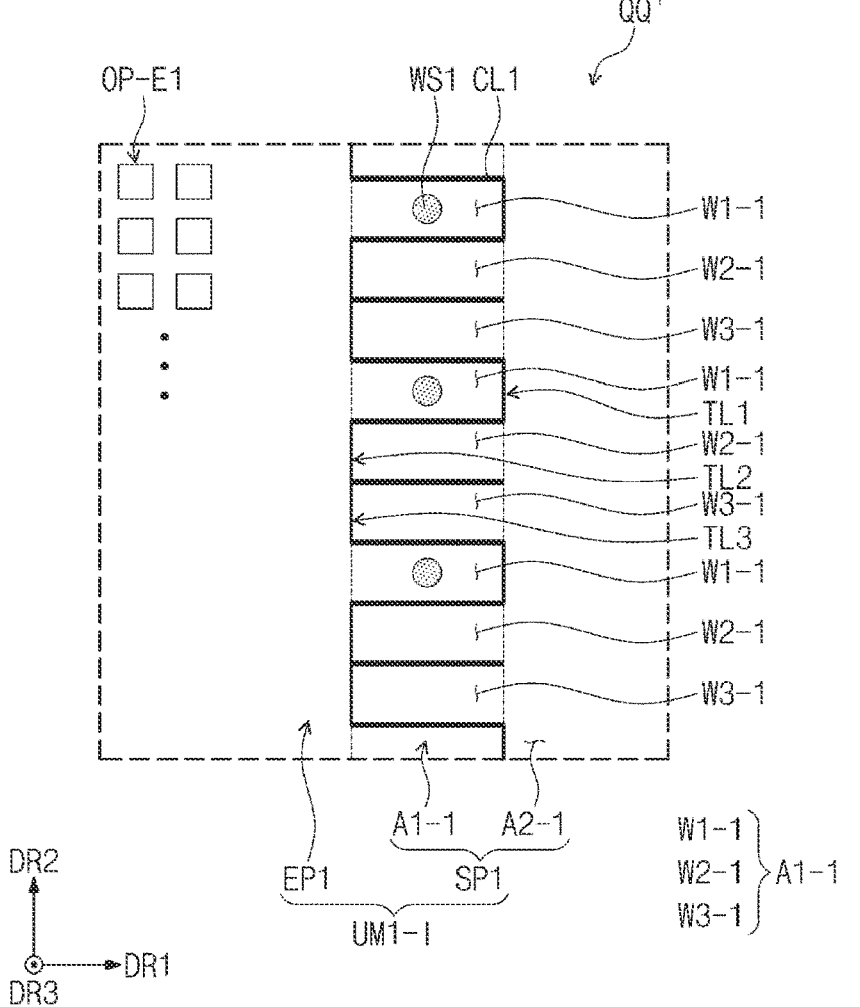
FIG. 5F is a plan view of a method of manufacturing a mask assembly according to an embodiment of the disclosure.

Referring to FIG. 5F, the cutting of the first preliminary unit mask UM1-I may include cutting a boundary between the first welding area W1-1 and the second area A2-1 or cutting the first welding area W1-1. A first trimming line TL1 may be defined in the first welding area W1-1, and the first preliminary unit mask UM1-I may be cut along the first trimming line TL1.

The first trimming line TL1 may be defined as the boundary between the first welding area W1-1 and the second area A2-1. According to an embodiment, the first trimming line TL1 may be defined as a line disposed closer to the second area A2-1 than the first welding protrusion WS1 in the first welding area W1-1 and extending from one first cutting line among two first cutting lines CL1 defining the first welding area W1-1 to the other first cutting line among the two first cutting lines CL1. FIG. 5F shows a structure in which the first trimming line TL1 is defined as the boundary between the first welding area W1-1 and the second area A2-1.

According to the embodiment, the first welding protrusion WS1 may remain on the open mask OM after the first preliminary unit mask UM1-I is cut along the first trimming line TL1, and the coupling state between the cut first preliminary unit mask UM1-I and the open mask OM may be maintained.

The cutting of the first preliminary unit mask UM1-I may include cutting a boundary between the second welding area W2-1 and the first deposition portion EP1 or cutting the second welding area W2-1. A second trimming line TL2 may be defined in the second welding area W2-1, and the first preliminary unit mask UM1-I may be cut along the second trimming line TL2.

The second trimming line TL2 may be defined as the boundary between the second welding area W2-1 and the first deposition portion EP1. According to an embodiment, the second trimming line TL2 may be defined as a line extending from one first cutting line among two first cutting lines CL1 defining the second welding area W2-1 to the other first cutting line among the two first cutting lines CL1 defining the second welding area W2-1 in the second welding area W2-1. FIG. 5F shows the structure in which the second trimming line TL2 is defined as the boundary between the second welding area W2-1 and the first deposition portion EP1.

The cutting of the first preliminary unit mask UM1-I may include cutting a boundary between the third welding area W3-1 and the first deposition portion EP1 or cutting the third welding area W3-1. A third trimming line TL3 may be defined in the third welding area W3-1, and the first preliminary unit mask UM1-I may be cut along the third trimming line TL3.

The third trimming line TL3 may be defined as the boundary between the third welding area W3-1 and the first deposition portion EP1. According to an embodiment, the third trimming line TL3 may be defined as a line extending from one first cutting line among two first cutting lines CL1 defining the third welding area W3-1 to the other first cutting line among the two first cutting lines CL1 defining the third welding area W3-1 in the third welding area W3-1. FIG. 5F shows the structure in which the third trimming line TL3 is defined as the boundary between the third welding area W3-1 and the first deposition portion EP1.

According to an embodiment, as the third trimming line TL3 extends from one end of the second trimming line TL2, the second trimming line TL2 and the third trimming line TL3 may be defined as one line, however, they should not be limited thereto or thereby.

According to the embodiment, each of the first, second, and third trimming lines TL1, TL2, and TL3 may be provided in plural, and the first, second, and third trimming lines TL1, TL2, and TL3 may be repeatedly arranged in the direction in which the first, second, and third welding areas W1-1, W2-1, and W3-1 are arranged repeatedly.

Figure 5G:
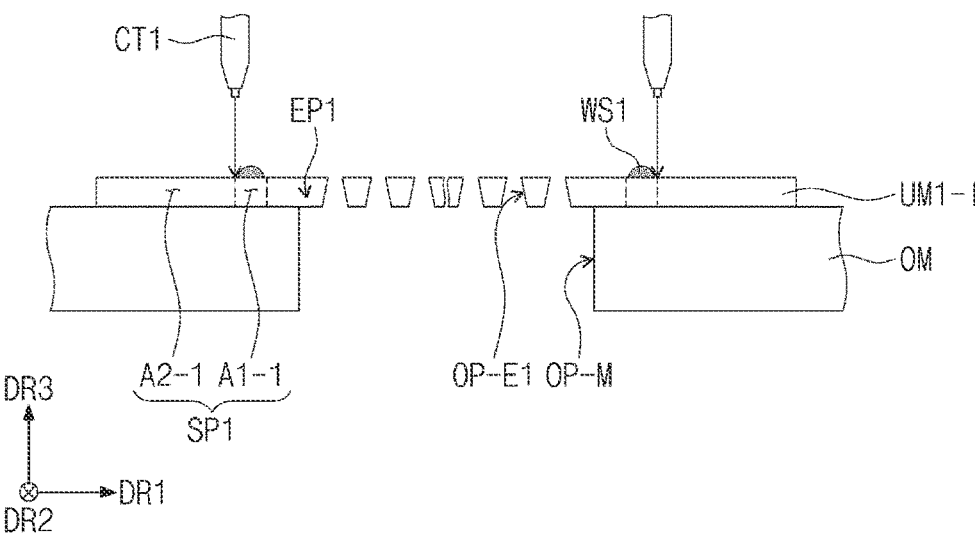
FIG. 5G is a schematic cross-sectional view of a method of manufacturing a mask assembly according to an embodiment of the disclosure.

As shown in FIG. 5G, the first preliminary unit mask UM1-I may be cut using a first cutter CT1 along the first, second, and third trimming lines TL1, TL2, and TL3. In the embodiment, the first cutter CT1 may irradiate a beam along the first, second, and third trimming lines TL1, TL2, and TL3 to cut the first preliminary unit mask UM1-I.

The first cutter CT1 may include various devices as along as the first cutter CT1 may provide a beam to the first preliminary unit mask UM1-I to remove the portion of the first preliminary unit mask UM1-I. For example, the first cutter CT1 may include a heat irradiator, a light irradiator, a laser oscillator, or the like.

The first, second, and third trimming lines TL1, TL2, and TL3 may be substantially simultaneously cut by the first cutter CT1, however, the disclosure should not be limited thereto or thereby. According to an embodiment, the first, second, and third trimming lines TL1, TL2, and TL3 may be sequentially cut one after another, or may be cut by separate cutters, respectively.

Figure 5H:
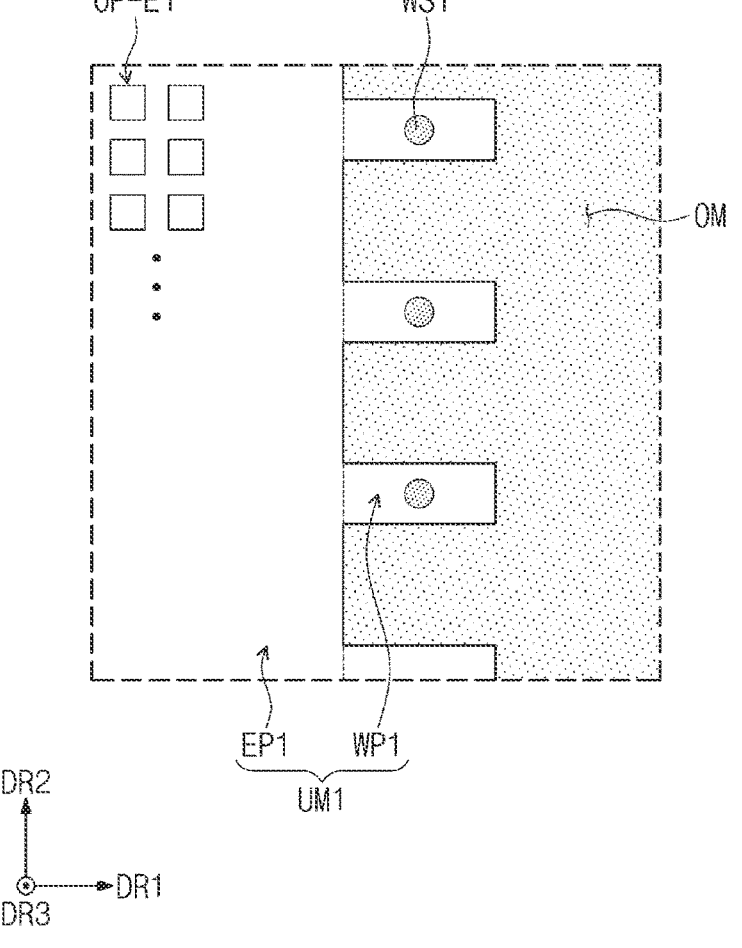
FIG. 5H is a plan view of a method of manufacturing a mask assembly according to an embodiment of the disclosure.
Figure 5I:
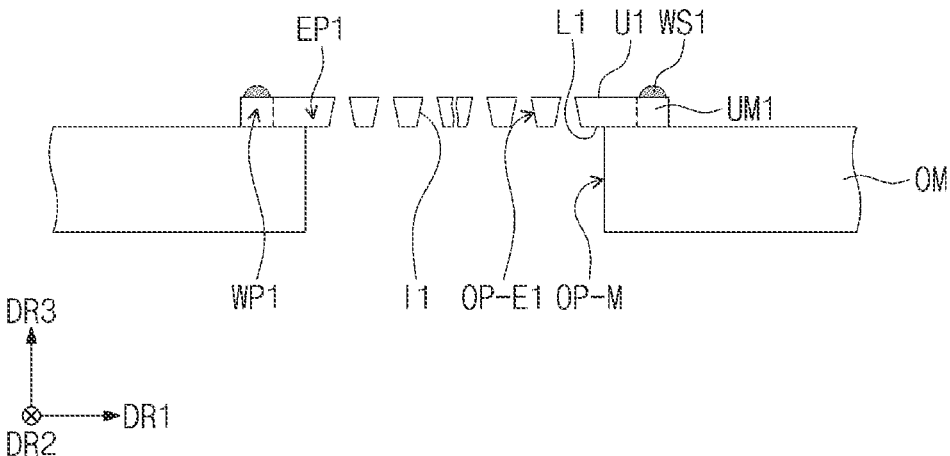
FIG. 5I is a schematic cross-sectional view of a method of manufacturing a mask assembly according to an embodiment of the disclosure.

As shown in FIGS. 5H and 5I, as the portion of the first preliminary unit mask UM1-I is cut along the first, second, and third trimming lines TL1, TL2, and TL3, at least a portion of the second welding area W2-1, at least a portion of the third welding area W3-1, and an entire portion of the second area A2-1 may be removed.

Accordingly, at least a portion of the first welding area W1-1 and the first deposition portion EP1 may remain on the open mask OM, and the first unit mask UM1 may be formed from the cut first preliminary unit mask UM1-I.

The first unit mask UM1 may include the first deposition portion EP1 and the first welding portions WP1.

In the embodiment, the first deposition portion EP1 may be cut along the second and third trimming lines TL2 and TL3 and then may be separated from at least a portion of the second welding area W2-1 (refer to FIG. 5F) and at least a portion of the third welding area W3-1 (refer to FIG. 5F). FIG. 5H shows a structure in which the second welding areas W2-1 (refer to FIG. 5F) and the third welding areas W3-1 (refer to FIG. 5F) are fully removed, however, the disclosure should not be limited thereto or thereby. According to an embodiment, a portion of the second welding areas W2-1 and a portion of the third welding areas W3-1 may not be removed.

In the embodiment, the first welding portions WP1 may be defined as portions that include the first welding areas W1-1 remaining on the open mask OM after the first preliminary unit mask UM1-I is cut along the first trimming lines TL1.

As described with reference to FIGS. 5A to 5I, the mask assembly MSA including the first unit mask UM1 may be completed through the manufacturing (S10, refer to FIG. 4) of the mask assembly MSA (refer to FIG. 2). The deposition process described with reference to FIG. 1 may be performed using the completed mask assembly MSA in the using of the mask assembly MSA (S20, refer to FIG. 4).

According to the disclosure, in case that a portion of the first unit mask UM1 is damaged and the deposition quality is defective in the using of the mask assembly MSA (S20), the repairing of the mask assembly MSA (S30, refer to FIG. 4) may be performed.

The damage of the first unit mask UM1 may include a state in which the upper surface U1 and the lower surface L1 of the first unit mask UM1 and a portion of an inner side surface I1 defining the first deposition openings OP-E1 are damaged. The damage of the first unit mask UM1 may also include a state in which the first deposition openings OP-E1 are partially clogged due to the deposition material EM (refer to FIG. 1) accumulated in the first deposition openings OP-E1.

However, the disclosure should not be limited thereto or thereby, and according to an embodiment, even though a portion of the first unit mask UM1 is damaged in the manufacturing of the mask assembly MSA (S10), the repairing of the mask assembly MSA may be performed (S30).

Hereinafter, the repairing of the mask assembly MSA (S30) will be described.

FIGS. 6A and 6C to 6G are plan views showing a repair method of the mask assembly according to an embodiment of the disclosure. FIG. 6B is a schematic cross-sectional view showing the repair method of the mask assembly according to an embodiment of the disclosure. In FIGS. 6A to 6G, the same/similar reference numerals denote the same/similar elements in FIGS. 1 to 5H, and thus, detailed descriptions of the same/similar elements will be omitted.

Figure 6A:
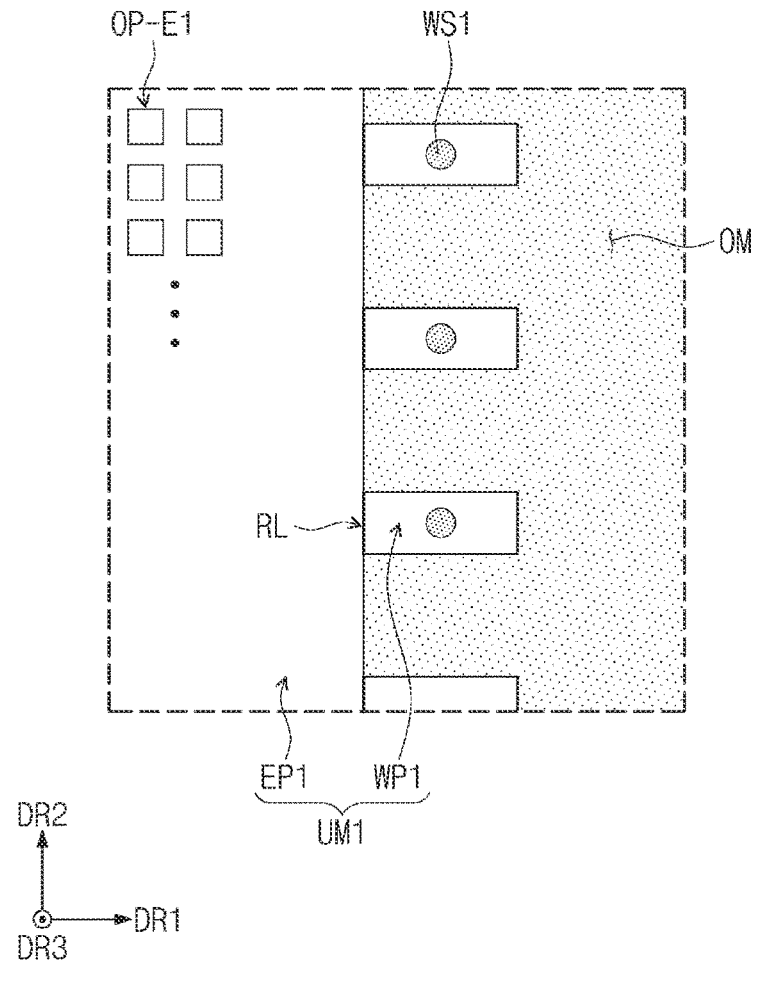
FIG. 6A is a plan view of a method of repairing a mask assembly according to an embodiment of the disclosure.
Figure 6B:
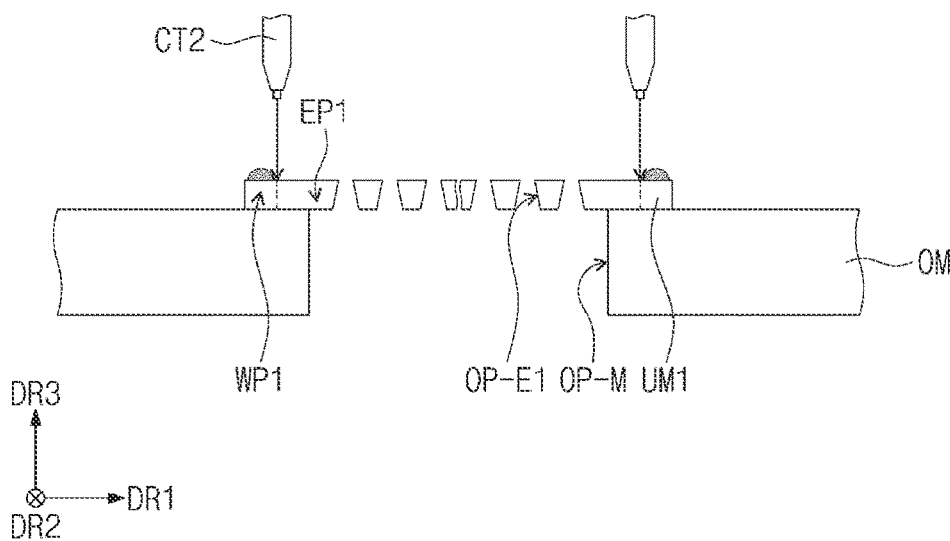
FIG. 6B is a schematic cross-sectional view of a method of repairing a mask assembly according to an embodiment of the disclosure.

Referring to FIG. 6A, the repairing (S30, refer to FIG. 4) of the mask assembly MSA (refer to FIG. 2) may include providing a mask assembly MSA.

According to the embodiment, the mask assembly MSA may include the frame FR (refer to FIG. 2), the open mask OM (refer to FIG. 2), the first unit mask UM1, and the first welding protrusions WS1.

The first unit mask UM1 may include the first deposition portion EP1 and the first welding portions WP1. The first welding protrusions WS1 may be disposed on the first welding portions WP1, respectively. The first unit mask UM1 and the first welding protrusions WS1 shown in FIG. 6A may correspond to the first unit mask UM1 and the first welding protrusions WS1 shown in FIG. 5H, respectively.

In the embodiment, the first unit mask UM1 may be the mask that is damaged in the using of the mask assembly MSA (S20, refer to FIG. 4) or in the manufacturing of the mask assembly MSA (S10, refer to FIG. 4).

Figure 6C:
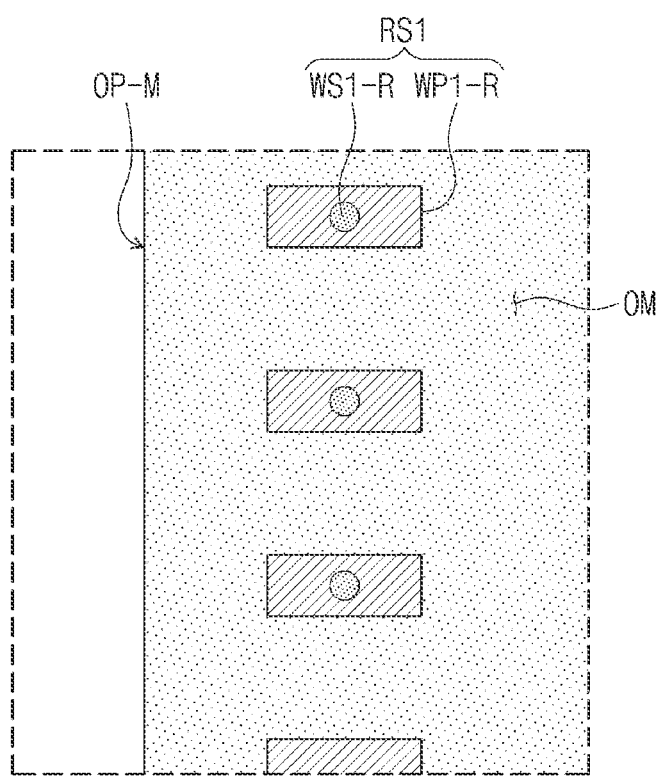
FIGS. 6C to 6G are plan views of a method of repairing a mask assembly according to an embodiment of the disclosure.
Figure 6C:
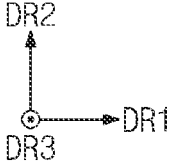

Referring to FIGS. 6A to 6C, the repairing (S30, refer to FIG. 4) of the mask assembly MSA (refer to FIG. 2) may include cutting a boundary between the first deposition portion EP1 and the first welding portions WP1 or cutting the first welding portions WP1. According to the embodiment, the first welding portions WP1 may be cut along repair lines RL, respectively.

Each of the repair lines RL may be defined as a boundary between the first deposition portion EP1 and a corresponding first welding portions WP1. According to an embodiment, each of the repair lines RL may be defined as a line disposed closer to the first deposition portion EP1 than the corresponding first welding protrusion WS1 in the corresponding first welding portion WP1 and extending from one first cutting line among two first cutting lines CL1 defining the corresponding first welding portion WP1 to the other first cutting line among the two first cutting lines CL1 defining the corresponding first welding portion WP1. For example, the repair line RL may be defined to cut an area of the first welding portion WP1 between a boundary of the first deposition portion EP1 and the first welding portion WP1 and the first welding protrusion WS1.

FIG. 6A shows the repair lines RL each being defined as the boundary between the corresponding first welding portion WP1 and the first deposition portion EP1 as an embodiment.

As shown in FIG. 6B, the first unit mask UM1 may be cut using a second cutter CT2 along the repair lines RL. In the embodiment, the second cutter CT2 may irradiate a beam along the repair lines RL to cut the first unit mask UM1.

The second cutter CT2 may include various devices as along as the second cutter CT2 may provide a beam to the first unit mask UM1 to remove the portion of the first unit mask UM1. For example, the second cutter CT2 may include a heat irradiator, a light irradiator, a laser oscillator, or the like.

After the portion of the first unit mask UM1 is cut along the repair lines RL, the first deposition portion EP1 may be removed. Accordingly, at least a portion of each of the first welding portions WP1 of the first unit mask UM1 and the first welding protrusions WS1 may remain on the open mask OM.

In a case different from the disclosure where the entire first unit mask UM1 is detached from the mask assembly MSA, the open mask OM may be damaged by an external force applied thereto during the detachment process of the first unit mask UM1. However, according to the disclosure, as the portion of the first unit mask UM1 is removed without detaching the entire first unit mask UM1, the damage of the open mask OM may be reduced. Accordingly, a deposition yield and a deposition reliability of the mask assembly MSA may be improved.

Referring to FIG. 6C, the first residual structures RS1 may be formed from the cut first unit mask UM1 (refer to FIG. 6A). The first residual structures RS1 may include the first residual welding portions WP1-R and the first residual welding protrusions WS1-R.

In the embodiment, the first residual welding portions WP1-R may be defined as first welding portions WP1 remaining on the open mask OM after cutting the first unit mask UM1 along the repair line RL among the first welding portions WP1.

FIG. 6C shows a structure in which all the first welding portions WP1 (refer to FIG. 6A) remain on the open mask OM and all the first welding portions WP1 are defined as the first residual welding portions WP1-R as an embodiment.

In the embodiment, the first residual welding protrusions WS1-R may be defined as the first welding protrusions WS1 (refer to FIG. 6A) remaining on the open mask OM after cutting the first unit mask UM1 along the repair lines RL.

Figure 6D:
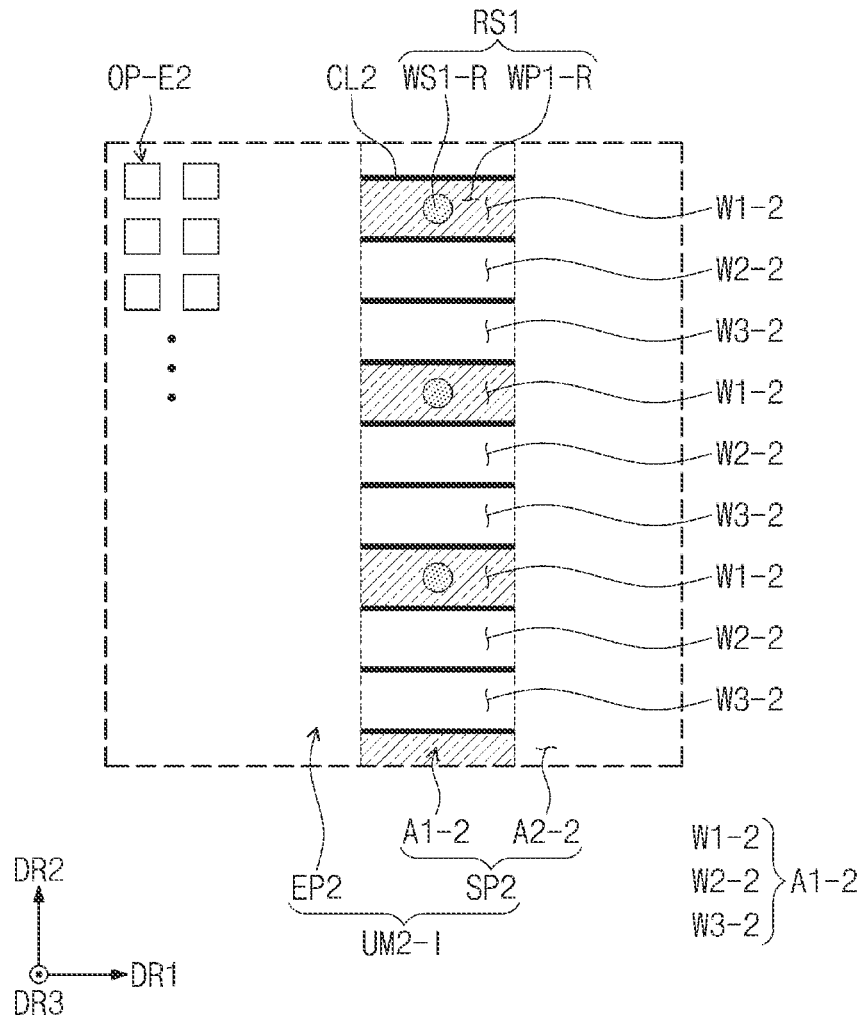

Referring to FIG. 6D, the repairing (S30, refer to FIG. 4) of the mask assembly MSA (refer to FIG. 2) may include placing a second preliminary unit mask UM2-I on the open mask OM.

According to an embodiment, the second preliminary unit mask UM2-I may include substantially the same configuration and shape as those of the first preliminary unit mask UM1-I shown in FIG. 5A. The first preliminary unit mask UM1-I may be defined as a preliminary unit mask for manufacture, and the second preliminary unit mask UM2-I may be defined as a preliminary unit mask for repair. In FIG. 6D, the same/similar reference numerals denote the same/similar elements of FIG. 5A, and thus, detailed descriptions of the same/similar elements will be omitted.

The second preliminary unit mask UM2-I may include the second deposition portion EP2 and a second edge portion SP2. The second deposition openings OP-E2 may be defined on the second deposition portion EP2.

The second edge portion SP2 may include a first area A1-2 and a second area A2-2. The first area A1-2 may include second cutting lines CL2. The first area A1-2 may include first, second, and third welding areas W1-2, W2-2, and W3-2 defined by the second cutting lines CL2. The second area A2-2 may be disposed outside the first area A1-2.

According to an embodiment, the placing of the second preliminary unit mask UM2-I on the open mask OM (refer to FIG. 5C) may proceed similarly to the placing of the first preliminary unit mask UM1-I shown in FIG. 5C.

In the embodiment, the first residual structures RS1 may be disposed between the second preliminary unit mask UM2-I and the open mask OM. The first residual structures RS1 may be disposed to respectively overlap the first welding areas W1-2. Accordingly, the first residual structures RS1 may entirely overlap the first welding areas W1-2, respectively.

According to the disclosure, since the second preliminary unit mask UM2-I includes the second cutting lines CL2 and the first residual structures RS1 are disposed to overlap one of the first, second, and third welding areas W1-2, W2-2, and W3-2 of the second preliminary unit mask UM2-I, a thickness of the first residual structures RS1 may not affect the deposition quality even though the first residual structures RS1 are disposed under the second preliminary unit mask UM2-I.

FIG. 6D shows a structure in which the first residual structures RS1 respectively overlap the first welding areas W1-2 as an embodiment, however, the first residual structures RS1 may be disposed to respectively overlap the third welding areas W3-2.

The repairing of the mask assembly MSA may further include tensioning the second preliminary unit mask UM2-I before placing of the second preliminary unit mask UM2-I on the open mask OM. The tensioning of the second preliminary unit mask UM2-I may proceed similarly to the tensioning of the first preliminary unit mask UM1-I shown in FIG. 5B.

Figure 6E:
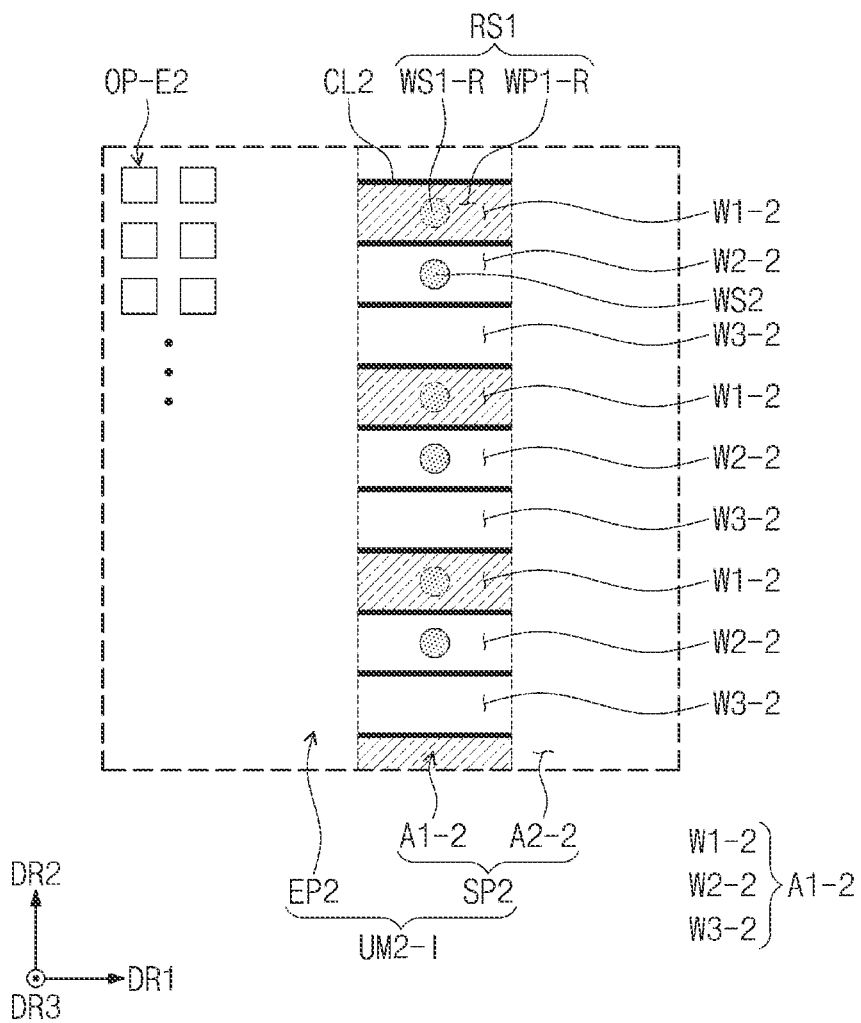

Referring to FIG. 6E, the repairing (S30, refer to FIG. 4) of the mask assembly MSA (refer to FIG. 2) may include welding the second preliminary unit mask UM2-I to the open mask OM (refer to FIG. 2).

According to the embodiment, a portion of the second welding areas W2-2 of the second preliminary unit mask UM2-I may be welded to the open mask OM, and thus, the second preliminary unit mask UM2-I may be welded to the open mask OM.

According to the disclosure, the welding process may be performed in an area of the first area A1-2, which does not overlap the first residual structures RS1, and thus, the second preliminary unit mask UM2-I may be coupled with the open mask OM even though the first residual structures RS1 remain on the open mask OM.

Although the first and second preliminary unit masks UM1-I and UM2-I having the same configuration and shape as each other are used, the areas used to weld among the welding areas W1-1 to W3-1 and W1-2 to W3-2, which are defined by the first and second cutting lines CL1 and CL2, may be changed in the first preliminary unit mask UM1-I and in the second preliminary unit mask UM2-I, and thus, the mask assembly may be repaired.

FIG. 6E shows the welding process performed in the second welding areas W2-2 as an embodiment, however, the welding process may be performed in the third welding areas W3-2.

The welding process of the second preliminary unit mask UM2-I and the open mask OM may proceed similarly to the welding process shown in FIG. 5E.

After the welding process is performed in the second welding areas W2-2, the second welding protrusions WS2 may be formed in the second welding areas W2-2. Each of the second welding protrusions WS2 may be disposed inside a corresponding second welding area among the second welding areas W2-2.

Figure 6F:
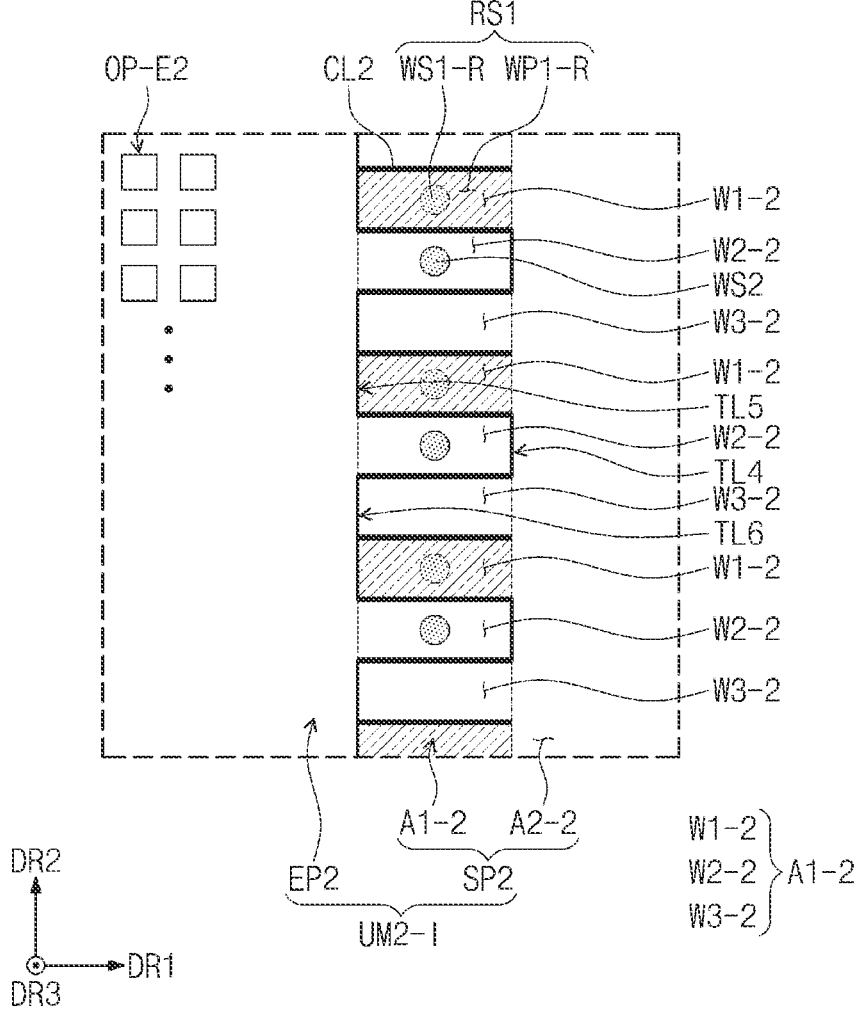
Figure 6G:
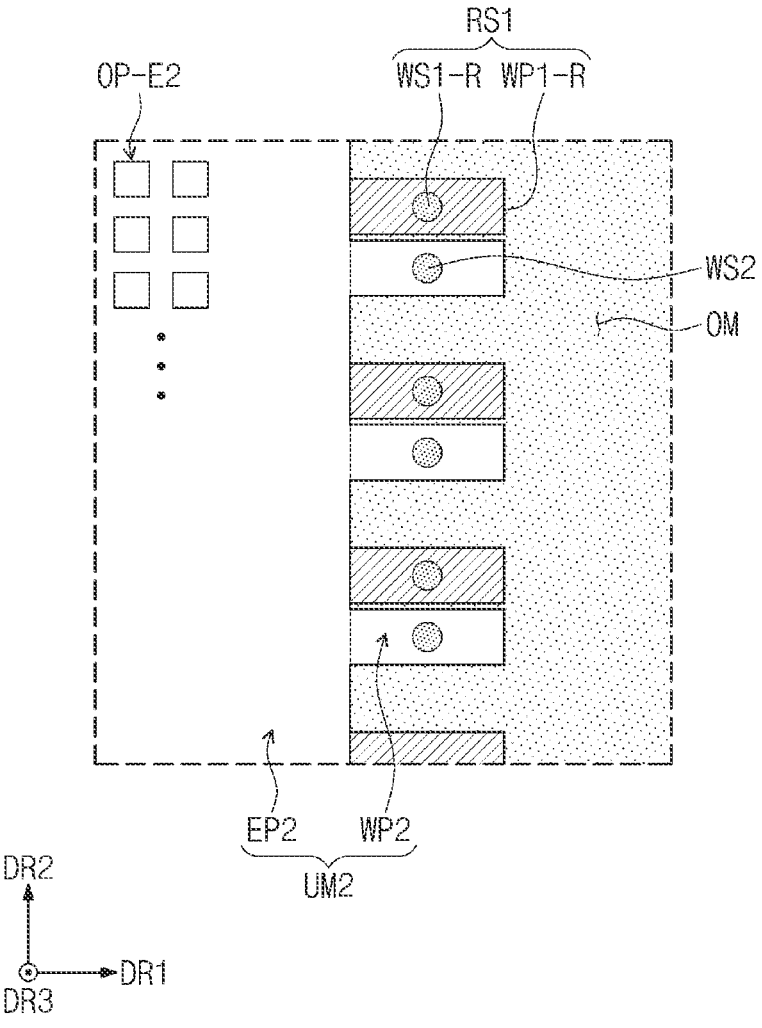

Referring to FIGS. 6F and 6G, the repairing (S30, refer to FIG. 4) of the mask assembly MSA (refer to FIG. 2) may include cutting the second preliminary unit mask UM2-I.

Referring to FIG. 6F, the cutting of the second preliminary unit mask UM2-I may include cutting a boundary between the second welding area W2-2 and the second area A2-2 or cutting the second welding area W2-2. A fourth trimming line TL4 may be defined in the second welding area W2-2, and the second preliminary unit mask UM2-I may be cut along the fourth trimming line TL4.

The fourth trimming line TL4 may be defined as a boundary between the second welding area W2-2 and the second area A2-2. According to an embodiment, the fourth trimming line TL4 may be defined as a line disposed closer to the second area A2-2 than the second welding protrusion WS2 in the second welding area W2-2 and extending from one second cutting line among two second cutting lines CL2 defining the welding area W2-2 to the other second cutting line among the two second cutting lines CL2 defining the welding area W2-2. FIG. 6F shows the fourth trimming line TL4 defined as the boundary between the second welding area W2-2 and the second area A2-2 as an embodiment.

According to the embodiment, after the second preliminary unit mask UM2-I is cut along the fourth trimming line TL4, the second welding protrusion WS2 may remain on the open mask OM, and the coupling state between the cut second preliminary unit mask UM2-I and the open mask OM may be maintained.

The cutting of the second preliminary unit mask UM2-I may include cutting a boundary between the first welding area W1-2 and the second deposition portion EP2 or cutting the first welding area W1-2. A fifth trimming line TL5 may be defined in the first welding area W1-2, and the second preliminary unit mask UM2-I may be cut along the fifth trimming line TL5.

The fifth trimming line TL5 may be defined as a boundary between the first welding area W1-2 and the second deposition portion EP2. According to an embodiment, the fifth trimming line TL5 may be defined as a line extending from one second cutting line among two second cutting lines CL2 defining the first welding area W1-2 to the other second cutting line among the two second cutting lines CL2 defining the first welding area W1-2 in the first welding area W1-2. FIG. 6F shows the fifth trimming line TL5 defined as the boundary between the first welding area W1-2 and the second deposition portion EP2 as an embodiment.

According to an embodiment, the fifth trimming line TL5 may be defined to coincide with an end adjacent to the second area A2-2 of a corresponding first residual welding portion WP1-R or may be closer to the second deposition portion EP2 than to the end.

Accordingly, according to the disclosure, the second preliminary unit mask UM2-I remaining on the open mask OM after being cut along the fifth trimming line TL5 may be spaced apart from the first residual welding portion WP1-R, and an influence of the thickness of the first residual structure RS1 on the deposition quality may be reduced.

The cutting of the second preliminary unit mask UM2-I may include cutting a boundary between the third welding area W3-2 and the second deposition portion EP2 or cutting the third welding area W3-2. A sixth trimming line TL6 may be defined in the third welding area W3-2, and the second preliminary unit mask UM2-I may be cut along the sixth trimming line TL6.

The sixth trimming line TL6 may be defined as the boundary between the third welding area W3-2 and the second deposition portion EP2. According to an embodiment, the sixth trimming line TL6 may be defined as a line extending from one second cutting line among two second cutting lines CL2 defining the third welding area W3-2 to the other second cutting line among the two second cutting lines CL2 defining the third welding area W3-2 in the second welding area W2-2. FIG. 6F shows the sixth trimming line TL6 defined as the boundary between the third welding area W3-2 and the second deposition portion EP2 as an embodiment.

According to the embodiment, each of the fourth, fifth, and sixth trimming lines TL4, TL5, and TL6 may be defined in plural, and the fourth, fifth, and sixth trimming lines TL4, TL5, and TL6 may also be repeatedly arranged in a direction in which the first, second, and third welding areas W1-2, W2-2, and W3-2 are repeatedly arranged.

The cutting of the second preliminary unit mask UM2-I along the fourth, fifth, and sixth trimming lines TL4, TL5, and TL6 may proceed similarly to the cutting process shown in FIG. 5G.

As shown in FIGS. 6F and 6G, as the portion of the second preliminary unit mask UM2-I is cut along the fourth, fifth, and sixth trimming lines TL4, TL5, and TL6, at least a portion of the first welding area W1-2, at least a portion of the third welding area W3-2, and an entire portion of the second area A2-2 may be removed. Accordingly, at least a portion of the second welding area W2-2, the second area A2-2, and the second deposition portion EP2 may remain on the open mask OM.

The second unit mask UM2 may be formed from the cut second preliminary unit mask UM2-I. The second unit mask UM2 may include the second deposition portion EP2 and the second welding portions WP2.

In the embodiment, the second deposition portion EP2 may be separated from at least the portion of the first welding area W1-2 and at least the portion of the third welding area W3-2 after the second preliminary unit mask UM2-I is cut along the fifth and sixth trimming lines TL5 and TL6. FIG. 6G shows a structure in which the first welding areas W1-2 and the third welding areas W3-2 are completely removed as an embodiment. However, the disclosure should not be limited thereto or thereby, and according to an embodiment, a portion of the first welding areas W1-2 and a portion of the third welding areas W3-2 may not be removed.

In the embodiment, the second welding portions WP2 may be defined as portions that include the second welding areas W2-2 remaining on the open mask OM among the second welding areas W2-2 after the second preliminary unit mask UM2-I is cut along the fourth trimming lines TL4.

The first residual structures RS1 may be exposed without being covered by the open mask OM.

According to the disclosure, as the preliminary unit mask is provided with the cutting lines defined therein, the trimming lines extending in the direction intersecting the extension direction of the cutting lines may be set differently for each welding area in the cutting of the preliminary unit mask to form the unit mask. For example, the cutting area of the preliminary unit mask may be readily set. Accordingly, the trimming lines may be set such that newly formed welding protrusions are not removed and the portions overlapping the residual structures are removed, and thus, the unit mask spaced apart from the residual structures may be manufactured. Accordingly, the mask assembly MSA may be repaired multiple times, and thus, a production yield of the display panel DP (refer to FIG. 9) may be improved.

In case that the second unit mask UM2 is damaged, the boundary between the second deposition portion EP2 and the second welding portions WP2 or the second welding portions WP2 may be cut in the same manner described with reference to FIGS. 6A to 6C such that at least the second deposition portion EP2 is removed from the mask assembly MSA, and thus, the damaged second unit mask UM2 may be removed.

The new unit mask may be coupled with the open mask OM by the welding process performed in the third welding area W3-2 in the same manner described with reference to FIGS. 6D to 6G.

In the disclosure, the structure in which the first, second, and third welding areas W1-1, W2-1, W3-1, W1-2, W2-2, and W3-2 arranged parallel to each other are repeatedly arranged is shown as an embodiment, however, the number of the repeated welding areas should not be limited thereto or thereby. For example, the number of the repeated welding areas may be larger than that shown in figures. The processes shown in FIGS. 6A to 6G may be repeated corresponding to the number of the repeated welding areas.

Figure 7A:
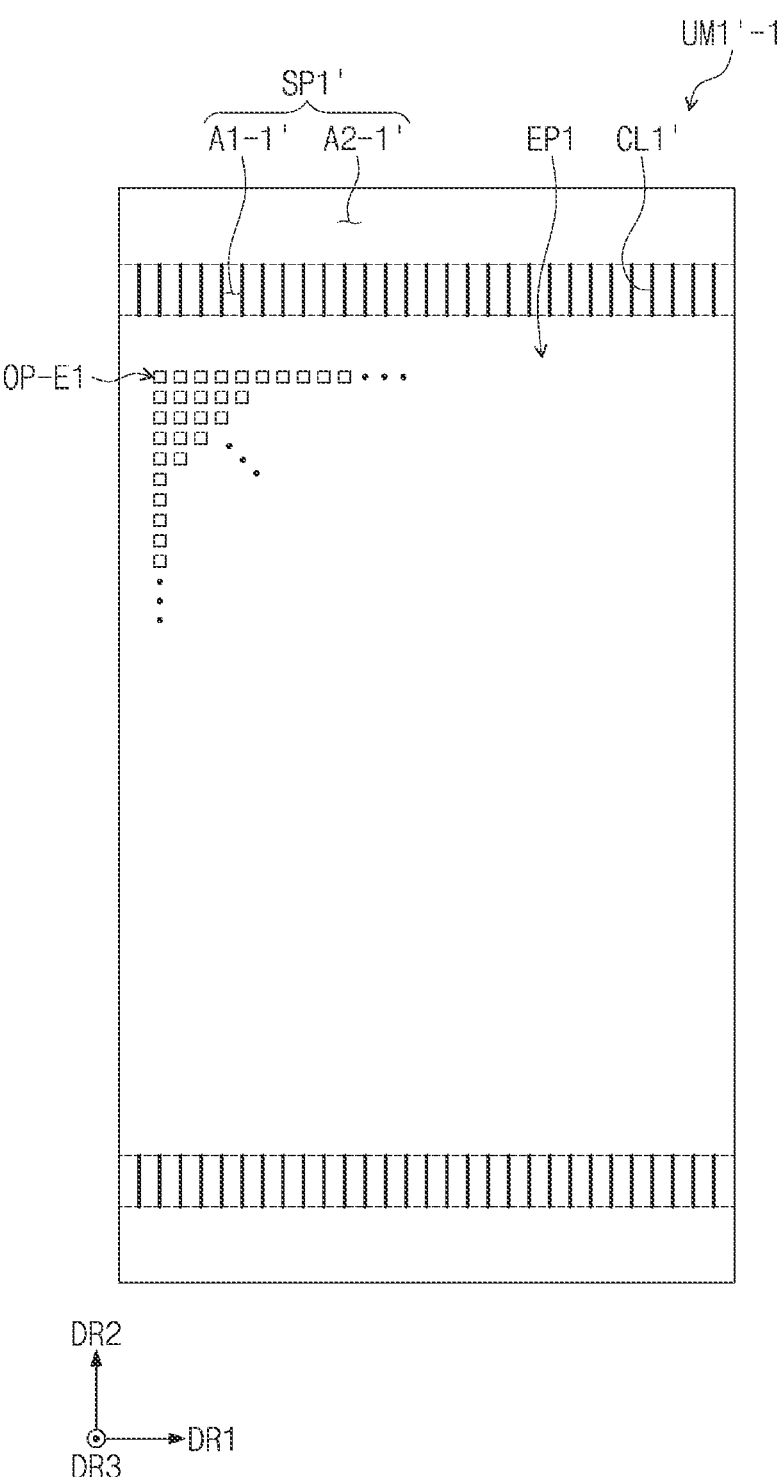
FIG. 7A is a plan view of a method of manufacturing a mask assembly according to an embodiment of the disclosure.
Figure 7B:
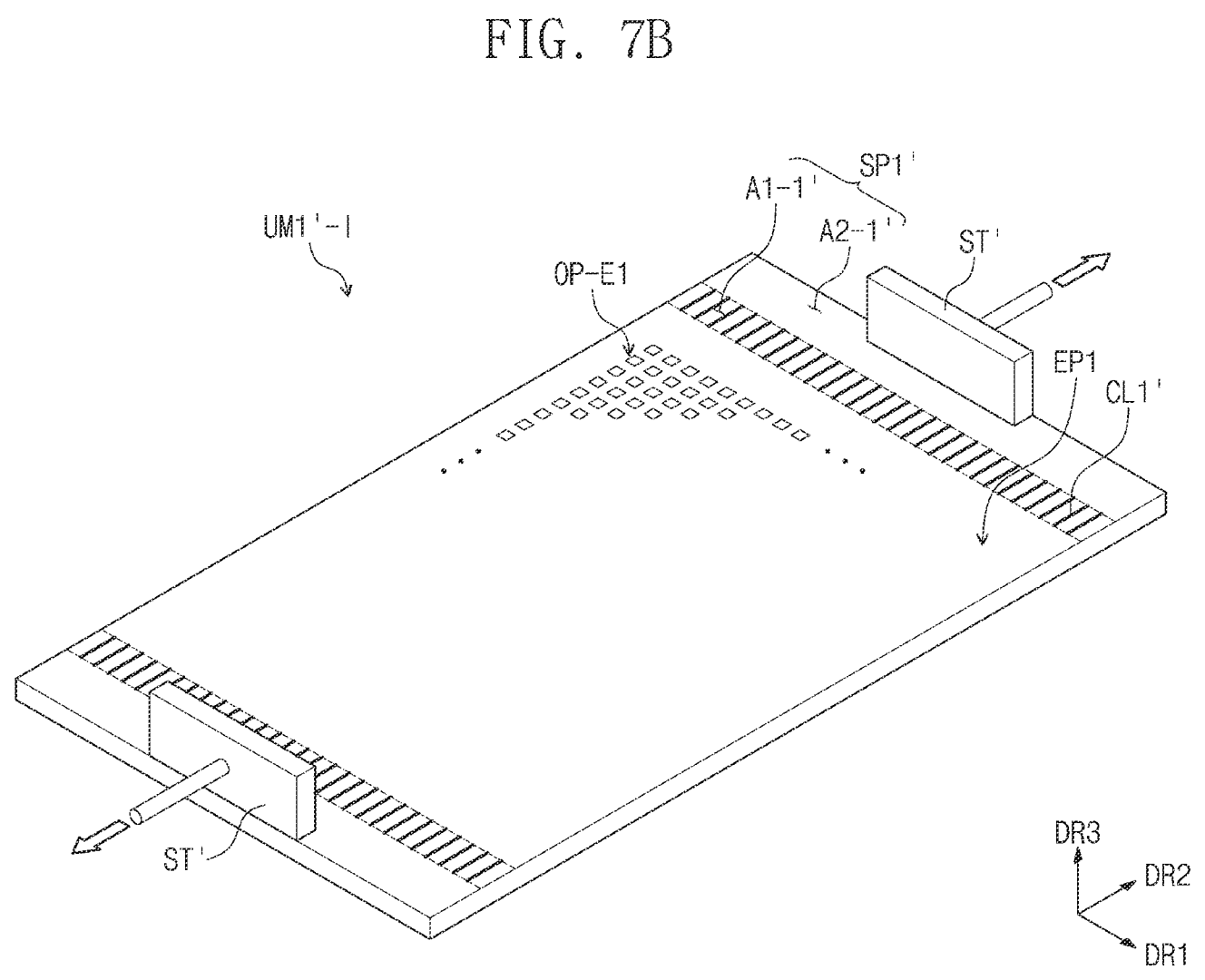

FIG. 7A is a plan view of a method of manufacturing a mask assembly according to an embodiment of the disclosure. FIG. 7B is a perspective view of a method of manufacturing a mask assembly according to an embodiment of the disclosure. In FIGS. 7A and 7B, the same/similar reference numerals denote the same/similar elements in FIGS. 1 to 6G, and thus, detailed descriptions of the same/similar elements will be omitted.

Referring to FIG. 7A, the manufacturing (S10, refer to FIG. 4) of the mask assembly MSA (refer to FIG. 2) may include providing a first preliminary unit mask UM1'-I.

The first preliminary unit mask UM1'-I may include a first deposition portion EP1 and first edge portions SP1'.

First deposition openings OP-E1 may be defined on the first deposition portion EP1. The first deposition portion EP1 and the first deposition openings OP-E1 of the first preliminary unit mask UM1'-I may respectively correspond to the first deposition portion EP1 and the first deposition openings OP-E1 of the first preliminary unit mask UM1-I described with reference to FIG. 5A.

In the embodiment, the first edge portions SP1' may extend from the first deposition portion EP1. The first edge portions SP1' may extend from the first deposition portion EP1 to the second direction DR2 and the direction opposite to the second direction DR2 and may include two first edge portions SP1' facing each other in the second direction DR2.

However, the disclosure should not be limited thereto or thereby. According to an embodiment, the first edge portions SP1' may extend from the first deposition portion EP1 to the first direction DR1 and the direction opposite to the first direction DR1 and may include two first edge portions SP1' facing each other in the first direction DR1.

Each of the first edge portions SP1' may include a first area A1-1' and a second area A2-1'. The first area A1-1' may be an area in which first cutting lines CL1' are defined. In the embodiment, each of the first cutting lines CL1' may extend in the second direction DR2, and the first cutting lines CL1' may be arranged in the first direction DR1. The second area A2-1' may be disposed outside the first area A1-1'.

Referring to FIG. 7B, the manufacturing (S10, refer to FIG. 4) of the mask assembly MSA (refer to FIG. 2) may include tensioning the first preliminary unit mask UM1'-I.

Support portions ST' may be disposed in the second areas A2-1' of the first preliminary unit mask UM1'-I. Each of the support portions ST' may be disposed adjacent to an end of the second areas A2-1' of the first preliminary unit mask UM1'-I.

The support portions ST' may apply a tensile force to the first preliminary unit mask UM1'-I in the second direction DR2 and the direction opposite to the second direction DR2, however, they should not be limited thereto or thereby. According to an embodiment, the first preliminary unit mask UM1'-I may include third edge portions SP1' extending from the second deposition portion EP2 to the first direction DR1, and the support portions ST' may apply the tensile force to the first preliminary unit mask UM1'-I to the first direction DR1 and the direction opposite to the first direction DR1.

Figure 8:
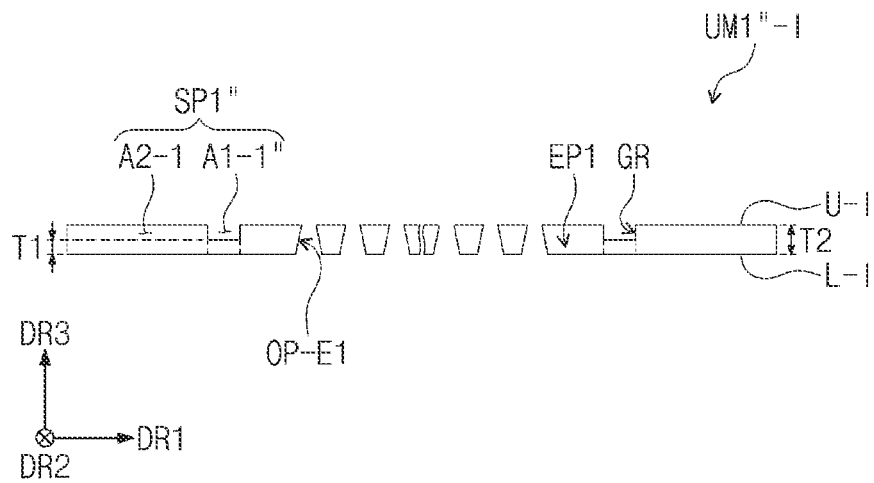
FIG. 8 is a schematic cross-sectional view of a mask assembly according to an embodiment of the disclosure.

FIG. 8 is a schematic cross-sectional view of a mask assembly according to an embodiment of the disclosure. FIG. 8 shows a schematic cross-section of a first preliminary unit mask UM1"-I provided in the manufacturing of the mask assembly MSA (refer to FIG. 2).

Referring to FIG. 8, the first unit mask UM1"-I may include a first deposition portion EP1 and first edge portions SP1".

First deposition openings OP-E1 may be defined on the first deposition portion EP1. The first deposition portion EP1 and the first deposition openings OP-E1 of the first preliminary unit mask UM1"-I may respectively correspond to the first deposition portion EP1 and the first deposition openings OP-E1 of the first preliminary unit mask UM1-I described with reference to FIG. 5A.

According to the embodiment, each of the first edge portions SP1" may include a first area A1-1" and a second area A2-1.

Each of the first areas A1-1" may include a groove GR defined therein and formed by removing a portion of the first preliminary unit mask UM1"-I along a direction from an upper surface U-I to a lower surface L-I of the first preliminary unit mask UM1"-I. Accordingly, a thickness of the first areas A1-1" may be smaller than a thickness of the first deposition portion EP1 and the second area A2-1.

According to the embodiment, as the first area A1-1" has a small thickness, first cutting lines CL1 may be readily formed in the first area A1-1". A portion of the first area A1-1" may be readily cut in the manufacturing of the mask assembly MSA (S10, refer to FIG. 4) and the repairing of the mask assembly MSA (S30, refer to FIG. 4).

According to an embodiment, the groove GR may be formed by removing a portion of the first preliminary unit mask UM1"-I in a portion of the first deposition portion EP1 and a portion of the second areas A2-1 as well as the first areas A1-1". According to an embodiment, a thickness in the whole area of the first edge portions SP1" may be smaller than the thickness of the first deposition portion EP1.

Figure 9:
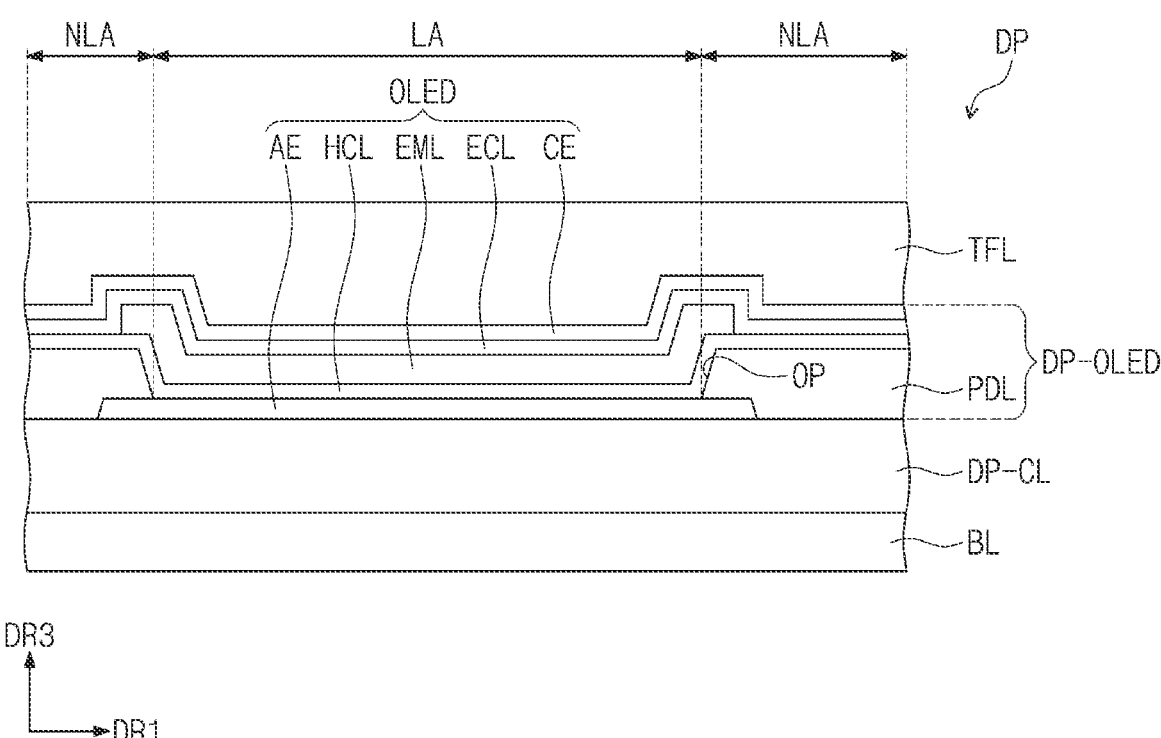
FIG. 9 is a schematic cross-sectional view of a display panel according to an embodiment of the disclosure.

FIG. 9 is a schematic cross-sectional view of the display panel DP according to an embodiment of the disclosure.

In the embodiment, the display panel DP may be a light emitting type display panel. The display panel DP may be one of an inorganic light emitting display panel and an organic light emitting display panel, but it should not be particularly limited.

According to an embodiment, the display panel DP may include a base layer BL, a circuit element layer DP-CL disposed on the base layer BL, a display element layer DP-OLED disposed on the circuit element layer DP-CL, and an encapsulation layer TFL disposed on the display element layer DP-OLED.

The base layer BL may be a glass substrate, a metal substrate, or a polymer substrate, however, it should not be limited thereto or thereby. The base layer BL may include an inorganic layer, an organic layer, or a composite material layer.

The circuit element layer DP-CL may include at least one insulating layer and a circuit element. The circuit element may include a signal line and a driving circuit of the pixel. The circuit element layer DP-CL may be formed by forming an insulating layer, a semiconductor layer, and a conductive layer using a coating or depositing process and patterning the insulating layer, the semiconductor layer, and the conductive layer using a photolithography process.

The display element layer DP-OLED may include a pixel definition layer PDL and a light emitting element OLED. The light emitting element OLED may be an organic light emitting diode or a quantum dot light emitting diode.

A first electrode AE may be disposed on the circuit element layer DP-CL. The pixel definition layer PDL may be provided with an opening OP defined therethrough to expose at least a portion of the first electrode AE. The opening OP of the pixel definition layer PDL may define a light emitting area LA. A non-light-emitting area NLA may surround the light emitting area LA.

A hole control layer HCL, an electron control layer ECL, and a second electrode CE may be commonly disposed in the light emitting area LA and the non-light-emitting area NLA. The hole control layer HCL and the electron control layer ECL may be commonly formed in the pixels using a mask different from the mask assembly MSA (refer to FIG. 2) described in the disclosure.

A light emitting layer EML may be patterned to correspond to the opening OP. The light emitting layer EML having a shape may be formed using the mask assembly MSA described above.

However, the disclosure should not be limited to the embodiments described above, and any component of the display panel DP may be formed using the deposition apparatus EDA (refer to FIG. 1) as long as the component is able be deposited though the mask assembly MSA.

The encapsulation layer TFL may be disposed on the light emitting element OLED. The encapsulation layer TFL may include multiple thin layers. The thin layers may include an inorganic layer and an organic layer. The encapsulation layer TFL may include an insulating layer to encapsulate the display element layer DP-OLED and an insulating layer to improve a light emission efficiency.

Although the embodiments of the disclosure have been described, it is understood that the disclosure should not be limited to these embodiments but various changes and modifications can be made by one ordinary skilled in the art within the spirit and scope of the disclosure as hereinafter claimed. Therefore, the disclosed subject matter should not be limited to any single embodiment described herein, and the scope of the disclosure shall be determined according to the attached claims.

What is claimed is:

1. A method of repairing a mask assembly, comprising:
   providing a mask assembly comprising:
   an open mask provided with an opening and disposed on a frame;
   a first unit mask disposed on the open mask and comprising:
   a first deposition portion on which first deposition openings are defined; and
   a first welding portion protruding from the first deposition portion in a protrusion direction away from the first deposition portion; and
   a first welding protrusion disposed on the first welding portion;
   cutting a boundary between the first deposition portion and the first welding portion or the first welding portion such that at least a portion of the first deposition portion is removed from the mask assembly;
   placing a first preliminary unit mask on the open mask, the first preliminary unit mask comprising:
   a second deposition portion on which second deposition openings are defined; and
   an edge portion extending from the second deposition portion, wherein
   the edge portion provided with cutting lines, which extend in a protrusion direction away from the second deposition portion, and are arranged in a direction intersecting the protrusion direction away from the second deposition portion,
   the edge portion comprises a first area and a second area,
   the first area comprises a first welding area, a second welding area, and a third welding area,
   the first welding area, the second welding area, and the third welding area are arranged in the intersecting direction and disposed between adjacent ones of the cutting lines, and the second area is disposed outside the first area;
welding the second welding area to the open mask; and
cutting the first preliminary unit mask to cut a boundary between the second welding area and the second area or the second welding area, a boundary between the first welding area and the second deposition portion or the first welding area, and a boundary between the third welding area and the second deposition portion or the third welding area, wherein
the first welding portion overlaps the first welding area in a plan view.

2. The method of claim 1, wherein in the cutting of the boundary between the first deposition portion and the first welding portion, an area of the first welding portion between a boundary of the first deposition portion and the first welding portion, and the first welding protrusion is cut.

3. The method of claim 1, wherein
a second welding portion is formed in the second welding area in the cutting of the first preliminary unit mask, and
the method further comprises cutting a boundary between the second deposition portion and the second welding portion or the second welding portion such that at least a portion of the second deposition portion is removed from the mask assembly after the cutting of the first preliminary unit mask.

4. The method of claim 1, wherein
a second welding protrusion is formed in the second welding area in the welding of the second welding area to the open mask, and
the second welding protrusion is disposed in the second welding area in a plan view.

5. The method of claim 1, wherein at least one of the cutting of the boundary between the first deposition portion and the first welding portion or the first welding portion and the cutting of the first preliminary unit mask is performed using a laser.

6. The method of claim 1, wherein a distance between adjacent ones of the cutting lines is equal to or greater than about 50 micrometers.

7. The method of claim 1, wherein a length of each of the cutting lines in the protrusion direction away from the second deposition portion is equal to or greater than about 50 micrometer.

8. The method of claim 1, wherein a width of each of the cutting lines in the intersecting direction is equal to or smaller than about 40 micrometers.

9. The method of claim 1, further comprising:
tensioning the first preliminary unit mask in at least one of a first direction and a second direction intersecting the first direction after the cutting of the boundary between the first deposition portion and the first welding portion or the first welding portion and before the placing of the first preliminary unit mask on the open mask.

10. The method of claim 1, further comprising:
manufacturing the mask assembly before the providing of the mask assembly, wherein the manufacturing of the mask assembly comprises:
placing a second preliminary unit mask on the open mask, the second preliminary unit mask comprising:
a third deposition portion on which third deposition openings are defined; and
an edge portion extending from the third deposition portion, wherein,
the edge portion of the second preliminary unit mask comprising:

cutting lines extending in a protrusion direction away from the third deposition portion, and arranged in a direction intersecting the protrusion direction away from the third deposition portion, a third area comprising a fourth welding area, a fifth welding area, and a sixth welding area, each arranged in the intersecting direction, and each being disposed between adjacent ones of the cutting lines; and a fourth area disposed outside the third area;

welding the fourth welding area to the open mask; and cutting the second preliminary unit mask to cut a boundary between the fourth welding area and the fourth area or the fourth welding area, a boundary between the fifth welding area and the third deposition portion or the fifth welding area, and a boundary between the sixth welding area and the third deposition portion or the sixth welding area.

* * * * *